(12) United States Patent
Ko et al.

(10) Patent No.: US 8,062,940 B2
(45) Date of Patent: Nov. 22, 2011

(54) METHOD OF MANUFACTURING SEMICONDUCTOR MEMORY DEVICE, AND SEMICONDUCTOR MEMORY DEVICE

(75) Inventors: Nikka Ko, Yokohama (JP); Tomoya Satonaka, Kawasaki (JP); Katsunori Yahashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 117 days.

(21) Appl. No.: 12/621,701

(22) Filed: Nov. 19, 2009

(65) Prior Publication Data

US 2010/0176368 A1 Jul. 15, 2010

(30) Foreign Application Priority Data

Jan. 14, 2009 (JP) ................. 2009-006067

(51) Int. Cl.
H01L 21/336 (2006.01)
H01L 21/8234 (2006.01)
H01L 21/8238 (2006.01)
H01L 21/8242 (2006.01)
H01L 21/20 (2006.01)

(52) U.S. Cl. ......... 438/197; 438/199; 438/253; 438/396

(58) Field of Classification Search .................. 438/129, 438/149, 153, 197, 167, 172, 199, 783, 238, 438/239, 241, 243, 244, 253, 259, 270, 271, 438/381, 386, 387, 393, 396

See application file for complete search history.

(56) References Cited

U.S. PATENT DOCUMENTS

| 6,130,450 | A | 10/2000 | Kohyama et al. |
| 7,317,208 | B2 * | 1/2008 | You .................................. 257/72 |
| 7,697,317 | B2 * | 4/2010 | Shimaoka et al. ............ 365/148 |

| 2006/0124980 | A1 * | 6/2006 | Kohyama et al. ............. 257/300 |
| 2008/0258129 | A1 | 10/2008 | Toda |
| 2009/0046495 | A1 | 2/2009 | Shimaoka et al. |

FOREIGN PATENT DOCUMENTS

| JP | 09-097880 | 4/1997 |
| JP | 2005-522045 | 7/2005 |
| JP | 2006-344349 | 12/2006 |
| JP | 2009-130139 | 6/2009 |

OTHER PUBLICATIONS

Notice Concerning Filing of Arguments issued by the Korean Intellectual Property Office on Jun. 27, 2011, for Korean Patent Application No. 10-2010-3127, and English-language translation thereof.

* cited by examiner

*Primary Examiner* — Chuong A. Luu
(74) *Attorney, Agent, or Firm* — Finnegan, Henderson, Farabow, Garrett & Dunner, L.L.P.

(57) ABSTRACT

A method of manufacturing semiconductor memory device comprises forming a first wiring layer and a memory cell layer above a semiconductor substrate; forming a plurality of first trenches extending in a first direction in the first wiring layer and the memory cell layer, thereby forming first wirings and separating the memory cell layer; burying a first interlayer film in the first trenches to form a stacked body; forming a second wiring layer above the stacked body; forming a plurality of second trenches, extending in a second direction intersecting the first direction and reaching an upper surface of the first interlayer film in depth, in the first stacked body with the second wiring layer formed thereabove, thereby forming second wirings; removing the first interlayer film isotropically; and digging the second trenches down to an upper surface of the first wirings, thereby forming memory cells.

16 Claims, 29 Drawing Sheets

II — BL — II'
III — Between BL-BL — III'

IV — WL — IV'
V — Between WL-WL — V'

METHOD OF MANUFACTURING SEMICONDUCTOR MEMORY DEVICE, AND SEMICONDUCTOR MEMORY DEVICE

CROSS-REFERENCE TO RELATED APPLICATION

This application is based upon and claims the benefit of priority from the prior Japanese Patent Application No. 2009-6067, filed on Jan. 14, 2009, the entire contents of which are incorporated herein by reference.

BACKGROUND OF THE INVENTION

1. Field of the Invention

The present invention relates to a method of manufacturing semiconductor memory device including memory cells of the cross-point type, and a semiconductor memory device.

2. Description of the Related Art

Electrically erasable programmable nonvolatile memories include a flash memory as well known in the art, which comprises a memory cell array of NAND-connected or NOR-connected memory cells having a floating gate structure. A ferroelectric memory is also known as a nonvolatile fast random access memory.

On the other hand, technologies of processing memory cells much finer include a resistance variable memory, which uses a variable resistive element in a memory cell as proposed. Specifically, known examples include a phase change memory device that varies the resistance in accordance with the variation in crystal/amorphous states of a chalcogenide compound; an MRAM device that uses a variation in resistance due to the tunnel magneto-resistance effect; a polymer ferroelectric RAM (PFRAM) memory device including resistive elements formed of a conductive polymer; and an ReRAM device that causes a variation in resistance on electrical pulse application (Patent Document 1: JP 2006-344349A).

The resistance variable memory may configure a memory cell with a serial circuit of a Schottky diode and a resistance variable element in place of the transistor. Accordingly, it can be stacked easier and three-dimensionally structured to achieve much higher integration as an advantage (Patent Document 2: JP 2005-522045A).

Such the memory cells of the cross-point type may be manufactured as aligned with line patterns through a self-aligned process. In this case, first, processing trenches extending in a first direction with a certain line-and-space (hereinafter referred to as "L/S") is applied to a stacked body including a lower wiring layer and a memory cell layer stacked thereon to form a plurality of first trenches, thereby separating the stacked body by the first trenches. Thereafter, an interlayer insulator film of $SiO_2$ is buried in the first trenches, and an upper wiring layer is formed thereon. Then, processing trenches extending in a second direction orthogonal to the first direction with a certain L/S is applied to the upper wiring layer and the stacked body with the interlayer insulator film buried therein to form a plurality of second trenches reaching the upper surface of the lower wiring layer in depth, thereby forming the memory cells of the cross-point type between mutually orthogonal lines.

In the above-described manufacturing process, however, it is difficult to achieve a selection ratio of 1:1 between the material for forming the memory cell layer and $SiO_2$ for forming the interlayer insulator film. Therefore, at the time of forming the second trenches, etching advances in the memory cell layer more than the interlayer insulator film. As a result, the residual interlayer insulator film serves as a mask to leave the residue of the memory cell material beneath the side wall of the interlayer insulator film, which may possibly cause a short between adjacent memory cells as a problem.

SUMMARY OF THE INVENTION

In an aspect the present invention provides a method of manufacturing semiconductor memory device, comprising: forming a first wiring layer above a semiconductor substrate; forming a first memory cell layer above the first wiring layer, the first memory cell layer being arranged to configure first memory cells therein; forming a plurality of first trenches in the first wiring layer and the first memory cell layer, the first trenches extending in a first direction, thereby forming first wirings extending in the first direction and separating the first memory cell layer by the first trenches; burying a first interlayer film in the first trenches to form a first stacked body; forming a second wiring layer above the first stacked body; forming a plurality of second trenches in the first stacked body with the second wiring layer formed thereabove, the second trenches extending in a second direction intersecting the first direction and reaching an upper surface of the first interlayer film in depth, thereby forming second wirings extending in the second direction; removing the first interlayer film isotropically from a portion exposed in the second trenches toward the interior; and digging the second trenches down to an upper surface of the first wirings after removing the first interlayer film isotropically, thereby forming the first memory cells in the shape of pillars separated by the first and second trenches at the intersections of the first and second wirings.

In another aspect the present invention provides a method of manufacturing semiconductor memory device, comprising: forming a first wiring layer above a semiconductor substrate; forming a first memory cell layer above the first wiring layer, the first memory cell layer arranged to configure first memory cells therein; forming a plurality of first trenches in the formed first wiring layer and the first memory cell layer, the first trenches extending in a first direction, thereby forming first wirings extending in the first direction and separating the first memory cell layer by the first trenches; burying a first interlayer film in the first trenches to form a first stacked body; forming a first sacrifice layer above the first stacked body, the first sacrifice layer extending in a second direction intersecting the first direction; backing the first interlayer film and then etching the first memory cell layer with a mask of the first sacrifice layer to form a plurality of second trenches reaching an upper surface of the first wirings in depth, thereby forming the first memory cells in the shape of pillars separated by the first and second trenches; removing the first interlayer film and the first sacrifice layer and burying a first interlayer insulator film in the first and second trenches to form a second stacked body; forming a second wiring layer above the second stacked body; and forming a plurality of third trenches in the second stacked body with the second wiring layer formed thereabove, the third trenches extending in the second direction and reaching an upper surface of the first interlayer insulator film in depth, thereby forming second wirings extending in the second direction.

In another aspect the present invention provides a semiconductor memory device, comprising: a plurality of first wirings extending in a first direction; a plurality of second wirings extending in a second direction intersecting the first direction; and a plurality of memory cells in the shape of pillars connected at the intersections of the first and second wirings between both lines. Adjacent ones of the memory cells have an air gap therebetween.

DETAILED DESCRIPTION OF THE EMBODIMENTS

The embodiments of the invention will now be described with reference to the drawings.

First Embodiment

Figure 1:
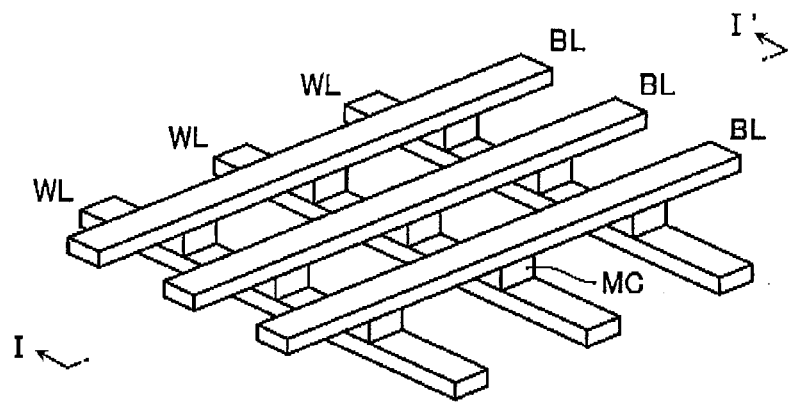
FIG. 1 is a perspective view showing part of a cell array of the cross-point type in a semiconductor memory according to a first embodiment of the present invention.
Figure 2A:
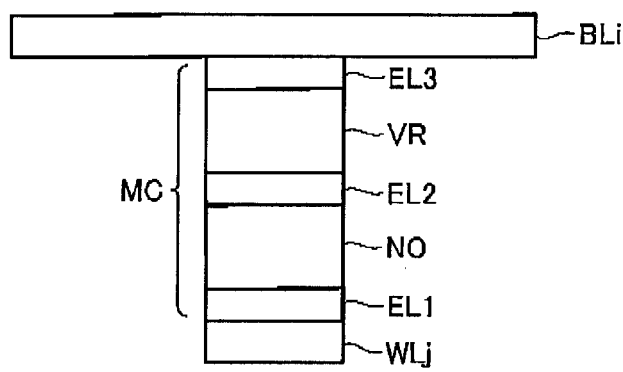
FIG. 2A is a cross-sectional view of one memory cell taken along I-I' line and seen from the direction of the arrow in FIG. 1.

FIG. 1 is a perspective view showing part of a cell array of the cross-point type in a semiconductor memory according to a first embodiment of the present invention. FIG. 2A is a cross-sectional view of one memory cell taken along I-I' line and seen from the direction of the arrow in FIG. 1, and FIG. 2B is an equivalent circuit diagram of the above memory cell.

In the memory cell array of the cross-point type, there are plural first wirings or word lines WL disposed in parallel, which cross plural second wirings or bit lines BL disposed in parallel. A memory cell MC is arranged at each intersection of both lines as sandwiched therebetween. Desirably, the first and second wirings are composed of heat-resistive low-resistance material such as W, WSi, NiSi, CoSi.

Figure 2B:
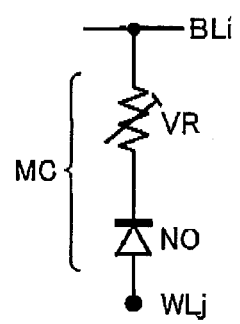
FIG. 2B is an equivalent circuit diagram of the memory cell in the semiconductor memory.

The memory cell MC comprises a serial connection circuit of a variable resistive element VR and a non-ohmic element NO as shown in FIGS. 2A, 2B.

The variable resistive element VR can vary the resistance with current, heat, or chemical energy on voltage application. Arranged on an upper and a lower surface thereof are electrodes EL2, EL3 serving as a barrier metal layer and an adhesive layer. Material of the electrodes may include Pt, Au, Ag, TiAlN, SrRuO, Ru, RuN, Ir, Co, Ti, TIN, TaN, LaNiO, Al, PtIrO$_x$, PtRhO$_x$, Rh/TaAlN. A metal film capable of achieving uniform orientation may also be interposed. A buffer layer, a barrier metal layer and an adhesive layer may further be interposed.

Available examples of the variable resistive element VR include: one that changes the resistance in accordance with a phase change between the crystalline state and the amorphous state, such as a chalcogenide (PCRAM); one that changes the resistance by precipitating metal cations to form a bridge (conducting bridge) between electrodes and ionizing the precipitated metal to destruct the bridge (CBRAM); and one that changes the resistance by applying a voltage or current (ReRAM) although there is no agreed theory (the factors in the resistance variation are roughly divided into two: one that causes a variation in resistance in accordance with the presence/absence of charge trapped in charge traps present in the electrode interface; and one that causes a variation in resistance in accordance with the presence/absence of the conduction path due to an oxygen loss and so forth).

Figure 3:
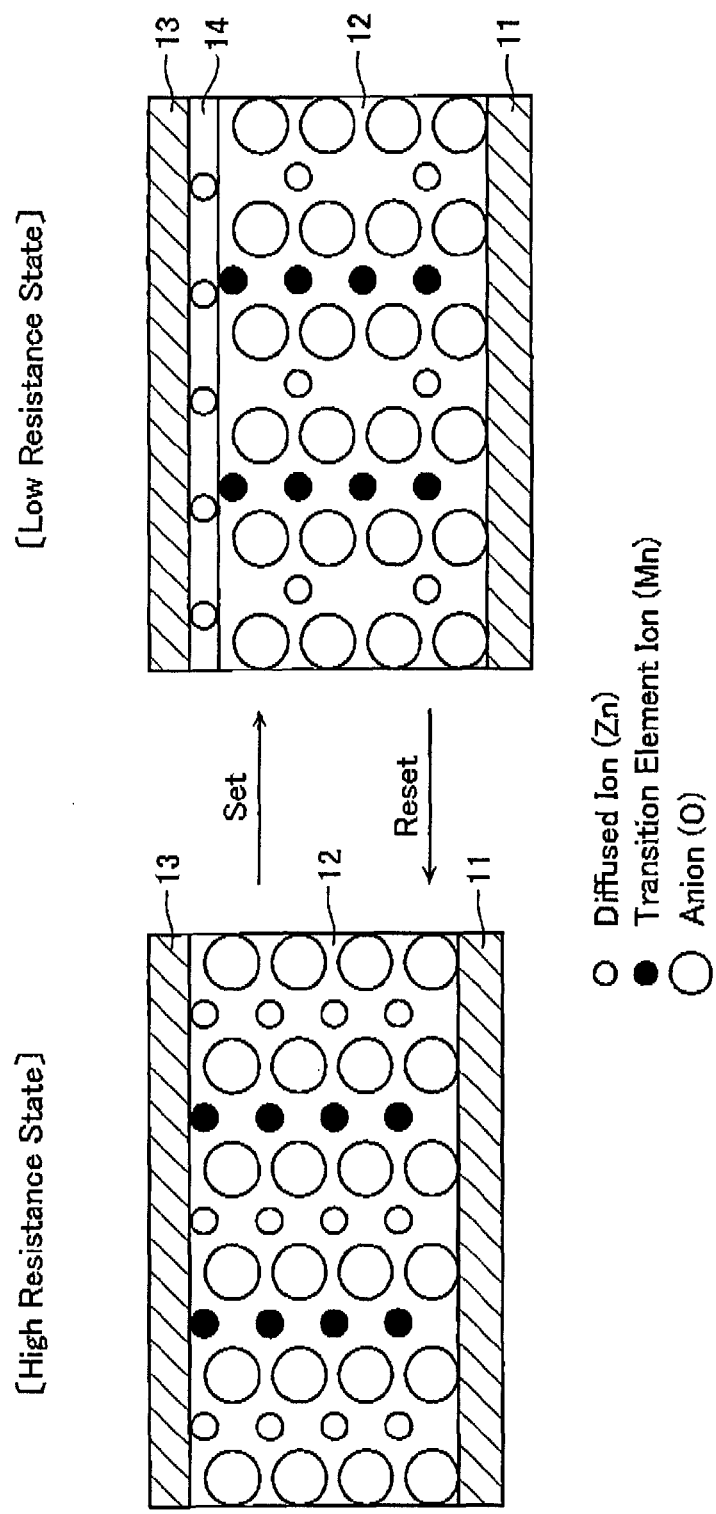
FIG. 3 is a diagram showing an example of ReRAM in the semiconductor memory.

FIG. 3 shows an example of the ReRAM. The ReRAM device shown in FIG. 3 includes a recording layer 12 arranged between electrode layers 11, 13. The recording layer 12 is composed of a composite compound containing at least two types of cation elements. At least one of the cation elements is a transition element, of which d-orbit is incompletely filled with electrons, and the shortest distance between adjacent cation elements is 0.32 nm or lower. Specifically, it is represented by a chemical formula $A_xM_yX_z$ (A and M are different elements) and may be formed of material having a crystal structure such as a spinel structure ($AM_2O_4$), an ilmenite structure ($AMO_3$), a delafossite structure ($AMO_2$), a LiMoN$_2$ structure ($AMN_2$), a wolframite structure ($AMO_4$), an olivine structure ($A_2MO_4$), a hollandite structure ($A_xMO_2$), a ramsdellite structure ($A_xMO_2$), and a perovskite structure ($AMO_3$).

In the example of FIG. 3, A comprises Zn, M comprises Mn, and X comprises O. In the recording layer 12, a small white circle represents a diffused ion (Zn), a large white circle represents an anion (O), and a small black circle represents a transition element ion (Mn). The initial state of the recording layer 12 is the high-resistance state. When the electrode layer 11 is kept at a fixed potential and the electrode layer 13 is supplied with a negative voltage, part of diffused ions in the recording layer 12 migrate toward the electrode layer 13 to reduce diffused ions in the recording layer 12 relative to anions. The diffused ions arrived at the electrode layer 13 accept electrons from the electrode layer 13 and precipitate as a metal, thereby forming a metal layer 19. Inside the recording layer 12, anions become excessive and consequently increase the valence of the transition element ion in the recording layer 12. As a result, the carrier injection brings the recording layer 12 into electron conduction and thus completes setting. On regeneration, a current may be allowed to flow, of which value is very small so that the material configuring the recording layer 12 causes no resistance variation. The programmed state (low-resistance state) may be reset to the initial state (high-resistance state) by supplying a large current flow in the recording layer 12 for a sufficient time for Joule heating, thereby facilitating the oxidation reduction reaction in the recording layer 12. Application of an electric field in the opposite direction from that at the time of setting may also allow resetting.

The non-ohmic element NO may include various diodes such as a Schottky diode, a PN-junction diode, a PIN diode, and may have a MIM (Metal-Insulator-Metal) structure, and a SIS (Silicon-Insulator-Silicon) structure. In this case, electrodes EL1, EL2 forming a barrier metal layer and an adhesive layer may be interposed. Material of the electrodes may include Pt, Au, Ag, TiAlN, SrRuO, Ru, RuN, Ir, Co, Ti, TiN, TaN, LaNiO, Al, PtIrO$_x$, PtRhO$_x$, Rh/TaAlN. If a diode is used, from the property thereof, it can perform the unipolar operation. In the case of the MIM structure or SIS structure, it can perform the bipolar operation. The non-ohmic element NO and the variable resistive element VR may be placed in the opposite relation to that in FIGS. 2A, 2B. The non-ohmic element NO may be reversed in polarity.

In the semiconductor memory of the present embodiment, a selected memory cell MC is supplied with a set voltage pulse at the time of set, a reset voltage pulse at the time of reset, and a read voltage pulse at the time of data read. Namely, the word line WL linked to the selected memory cell MC is given "H" level, and the bit line BL linked to the selected memory cell MC is given "L" level while other word lines WL are given "L" level and other bit lines BL are given "H" level. As a result, the selected memory cell MC is supplied with a voltage required for data set, reset or read to execute data set, reset or read to the selected memory cell MC. Other memory cells MC than the selected memory cell MC are supplied with a reverse bias voltage or 0 V and accordingly no current flows therein.

Figure 4:
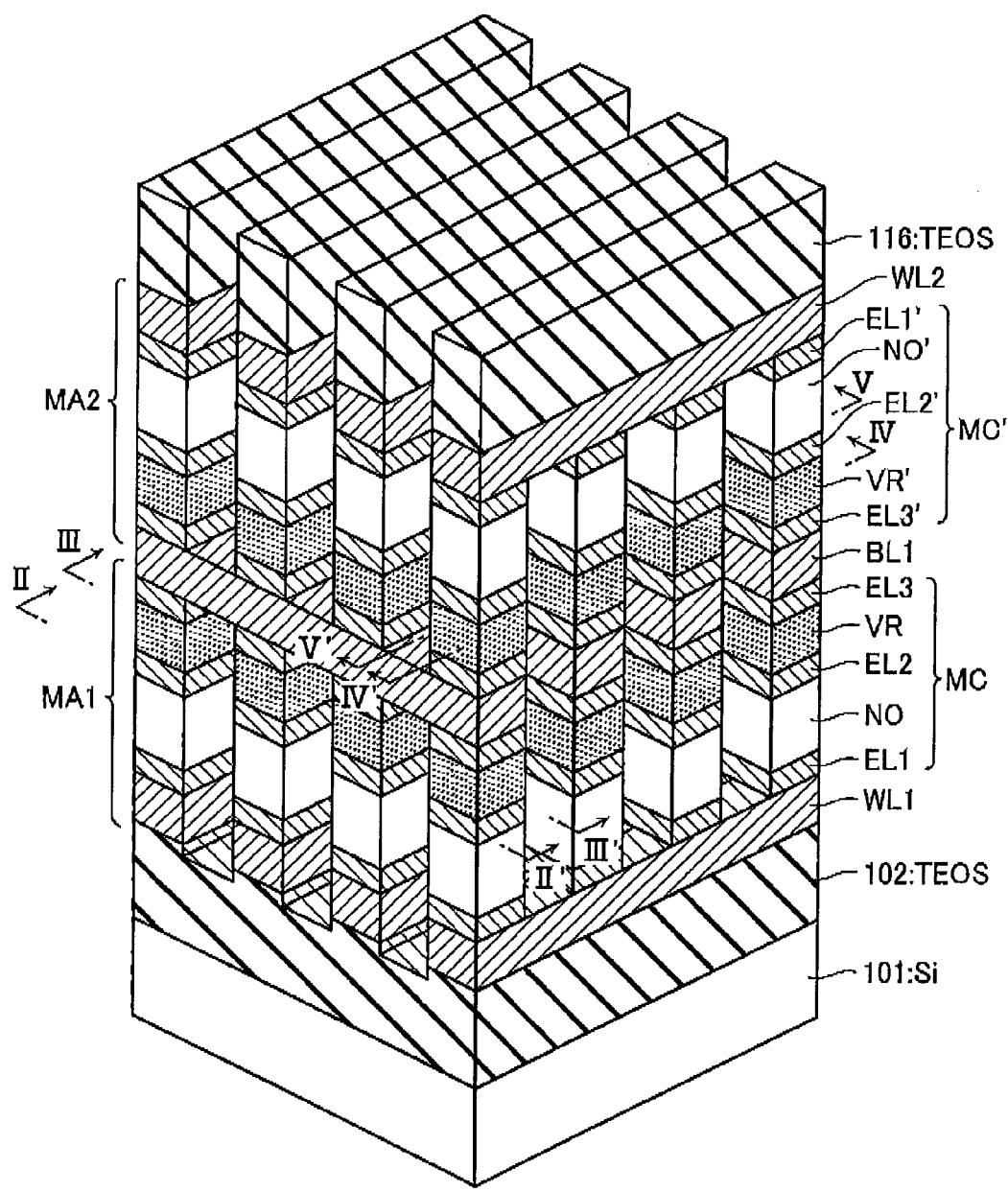
FIG. 4 is a perspective view showing part of a memory cell array in the semiconductor memory.

FIG. 4 is a perspective view showing part of the memory cell array in the semiconductor memory according to the present embodiment.

This memory cell array is a memory cell array of the double-layered structure, which includes cell array layers MA1, MA2 stacked on a silicon substrate 101, and bit lines BL1 shared by the upper and lower cell array layers MA1, MA2.

Namely, the silicon substrate 101 has impurity-diffused layers and gate electrodes of transistors contained in peripheral circuits, not shown, formed thereon. A TEOS (Tetra Ethyl Ortho Silicate) film 102 is stacked on the substrate. There are first wirings or plural word lines WL1 extending in a first direction formed on the TEOS film 102. On these word lines WL1, a first electrode EL1, a non-ohmic element NO, a second electrode EL2, a variable resistive element VR and a third electrode EL3 are formed in this order to configure memory cells MC in the cell array layer MA1. Further, on the memory cells MC in the cell array layer MA1, plural bit lines BL1 extending in a second direction orthogonal to the word lines WL1 are formed. On the bit lines BL1, a fourth electrode EL3', a variable resistive element VR', a fifth electrode EL2', a non-ohmic element NO' and a sixth electrode EL1' are formed in this order (the reverse order of the cell array layer MA1) to configure memory cells MC' in the cell array layer MA2. Further, on the memory cells MC' in the cell array layer MA2, plural word lines WL2 extending in the same direction as the word lines WL1 are formed. The memory cells MC, MC' are formed at the intersections of the word lines WL1 and the bit lines BL1 and the intersections of the bit lines BL1 and the word lines WL2 in the shape of vertically extending pillars, respectively. In an aspect of the following manufacturing method, air gaps may be formed consequently between adjacent word lines WL1, between the bit lines BL1, between the word lines WL2, between the memory cells MC and between the memory cells MC', respectively. In this case, it is possible to reduce the capacity between the memory cells MC to prevent the interference between the memory cells MC as an effect.

A TEOS film 116 is formed on the word lines WL2.

The memory cell array shown in FIG. 4 has the double-layered structure. In contrast, the layers from the first electrode EL1 to the bit line BL1 and the layers from the fourth electrode EL3' to the word line WL2 may be stacked alternately and repeatedly between the word lines WL2 and the TEOS film 116 to configure a memory cell array with an arbitrary number of stacked layers.

[Method of Manufacturing Memory Cell Array]

The following description is given to a method of manufacturing the memory cell array of the double-layered structure shown in FIG. 4.

For the purpose of forming transistors and so forth contained in necessary peripheral circuits on the silicon substrate 101, a FEOL (Front End Of Line) process is executed first, and the TEOS film 102 is deposited thereon. At this time, vias, not shown, are formed as well.

Subsequently, the upper part, including a first metal 103 to be turned to the word lines WL and subsequent portions, is formed.

Figure 5A:
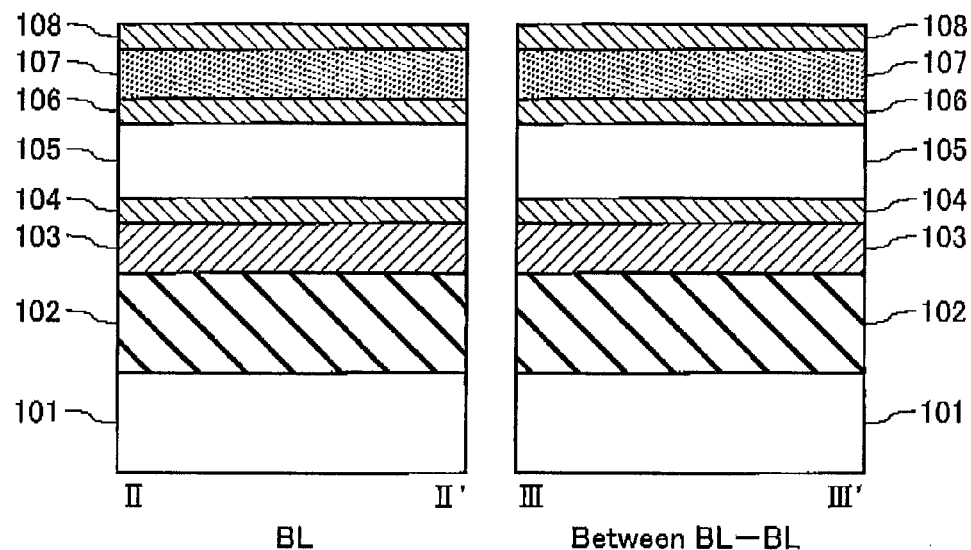
FIGS. 5A and 5B are cross-sectional views showing the step of forming the memory cell array in the semiconductor memory in order of process.
Figure 5B:
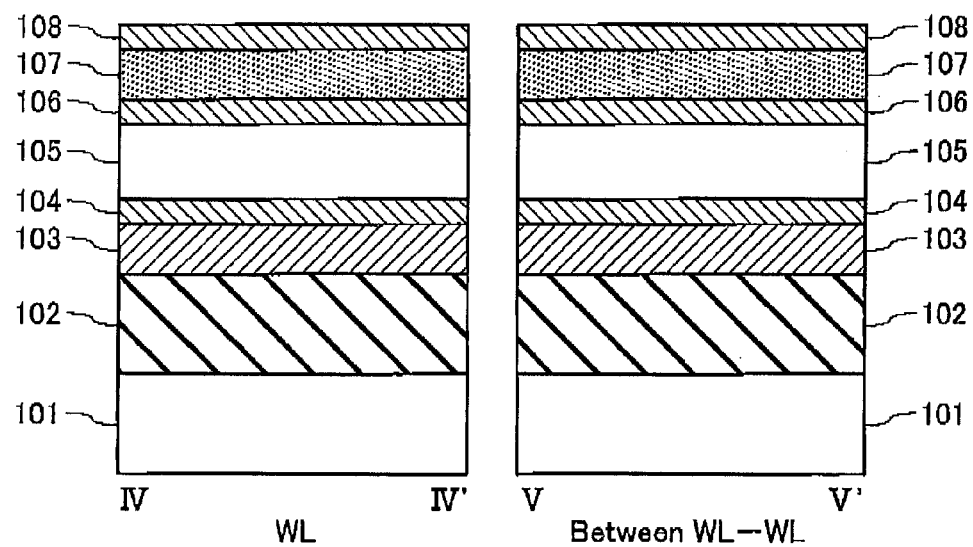
Figure 6A:
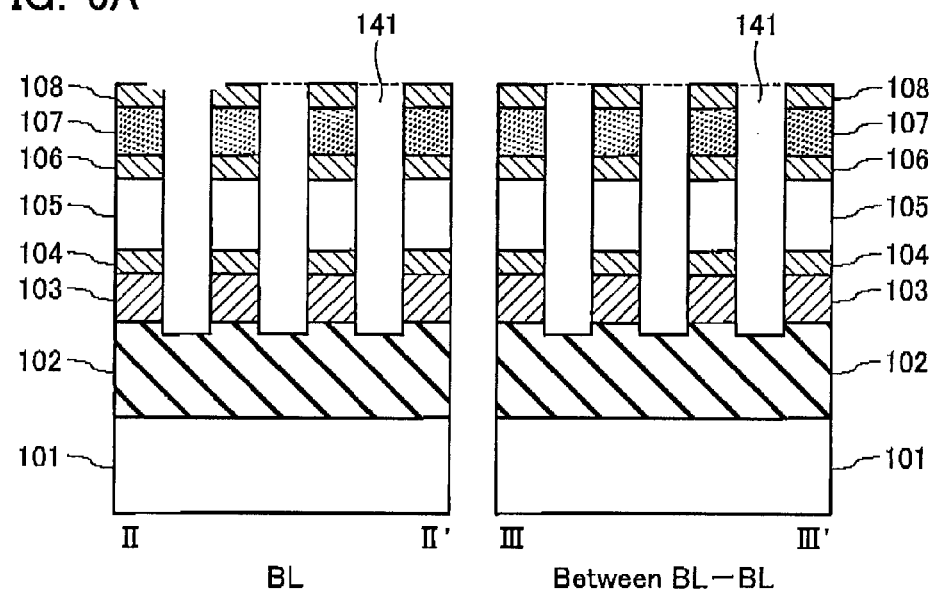
FIGS. 6A and 6B are cross-sectional views showing the step of forming the memory cell array in the semiconductor memory in order of process.
Figure 6B:
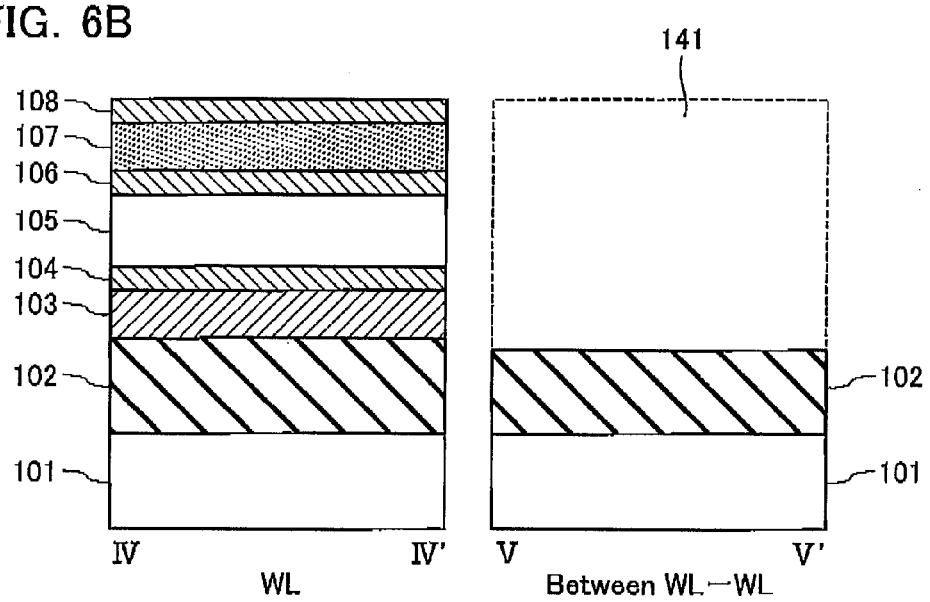

FIGS. 5A-17B are cross-sectional views showing the steps of forming the upper part in order of process. FIGS. 5A, 6A, . . . , FIG. 17A are cross-sectional views from the word line WL direction, and the left figures and the right figures are cross-sectional views seen from II-II' (within the bit line BL) and III-III' (between the bit lines BL) of FIG. 4, respectively. FIGS. 5B, 6B, . . . , FIG. 17B are cross-sectional views from the bit line BL direction, and the left figures and the right figures are cross-sectional views seen from IV-IV' (within the word line WL) and V-V' (between the word lines WL) of FIG. 4, respectively. Appropriately referring to FIGS. 5A-17B, the process of forming the upper portion is described.

As described above, after the TEOS film 102 and the vias are formed, the first wiring layer 103 to be turned to the word line WL1 is deposited thereon. Further thereon, as the material of the first memory cell MC, a layer 104 to be turned to the first electrode EL1, a layer 105 to be turned to the non-ohmic element NO, a layer 106 to be turned to the second electrode EL2, a layer 107 to be turned to the variable resistive element VR, and a layer 108 to be turned to the third electrode EL3 are deposited in turn to form a first memory cell layer. Through the above steps, a stacked structure shown in FIGS. 5A, 5B is formed.

Subsequently, a certain L/S hard mask of TEOS or the like, not shown, is formed on the upper surface of the stacked body and it is used as a mask to execute a first anisotropic etching such as RIE to form first trenches 141 along the word lines WL1 to separate the first memory cell layer as shown in FIGS. 6A, 6B.

Figure 7A:
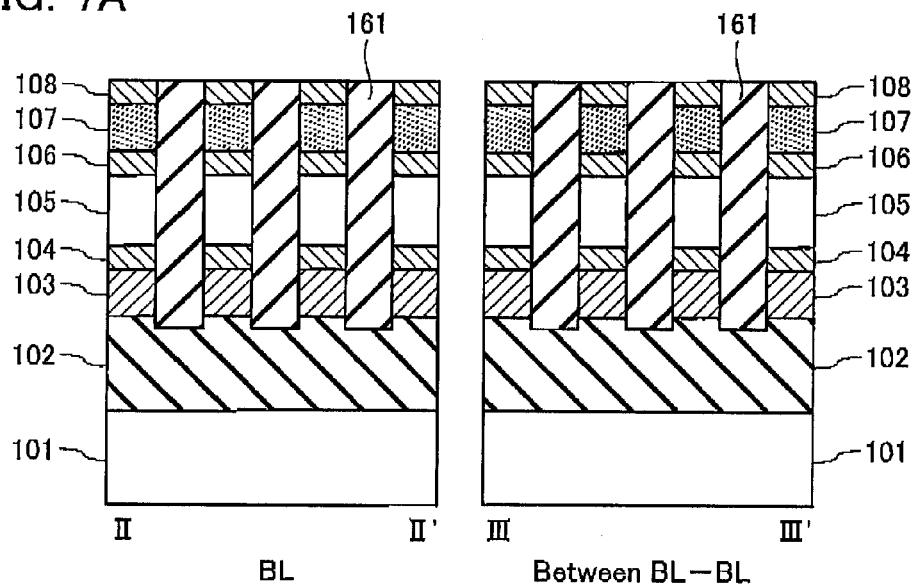
FIGS. 7A and 7B are cross-sectional views showing the step of forming the memory cell array in the semiconductor memory in order of process.
Figure 7B:
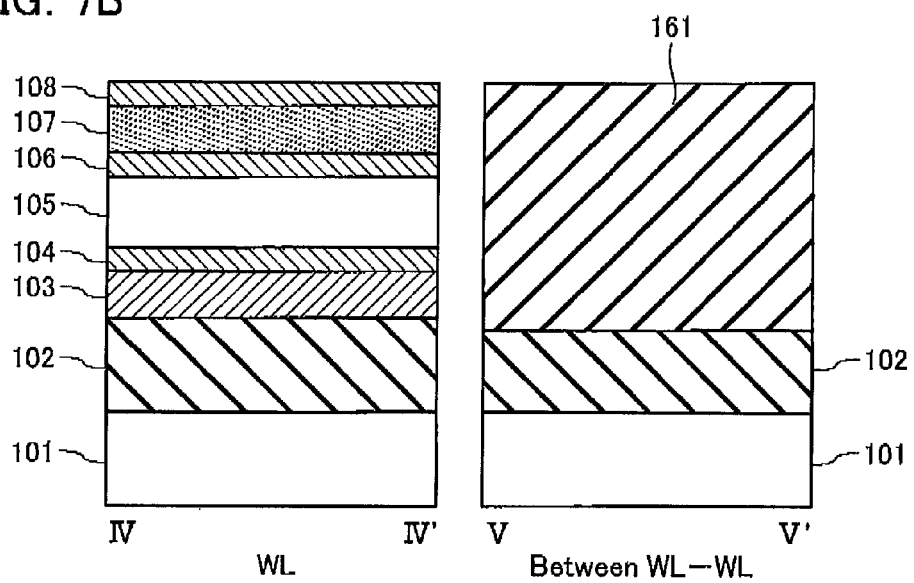

Subsequently, as shown in FIGS. 7A, 7B, a coating method or the like is used to fill the first trenches 141 with an organic interlayer film, that is, a first interlayer film 161. The interlayer film 161 comprises an organic film such as a carbon-containing film. For an inorganic film, it is difficult to achieve a sufficient etching selection ratio to the memory cell material while the use of the organic film achieves a sufficiently large etching selection ratio. The carbon-containing film may be porous to improve the nonconductivity between the memory cells. Subsequently, planarization by CMP or the like is executed to remove extra portions from the first interlayer film 161 and expose the layer 108 to be turned to the third electrode EL3 to form a first stacked body filled with the first interlayer film 161.

Figure 8A:
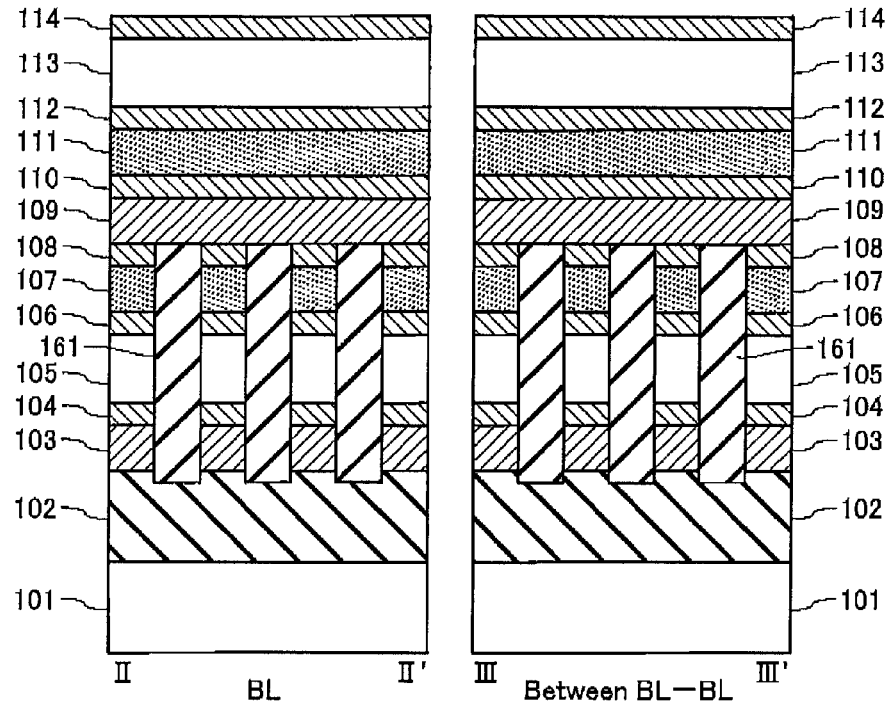
FIGS. 8A and 8B are cross-sectional views showing the step of forming the memory cell array in the semiconductor memory in order of process.
Figure 8B:
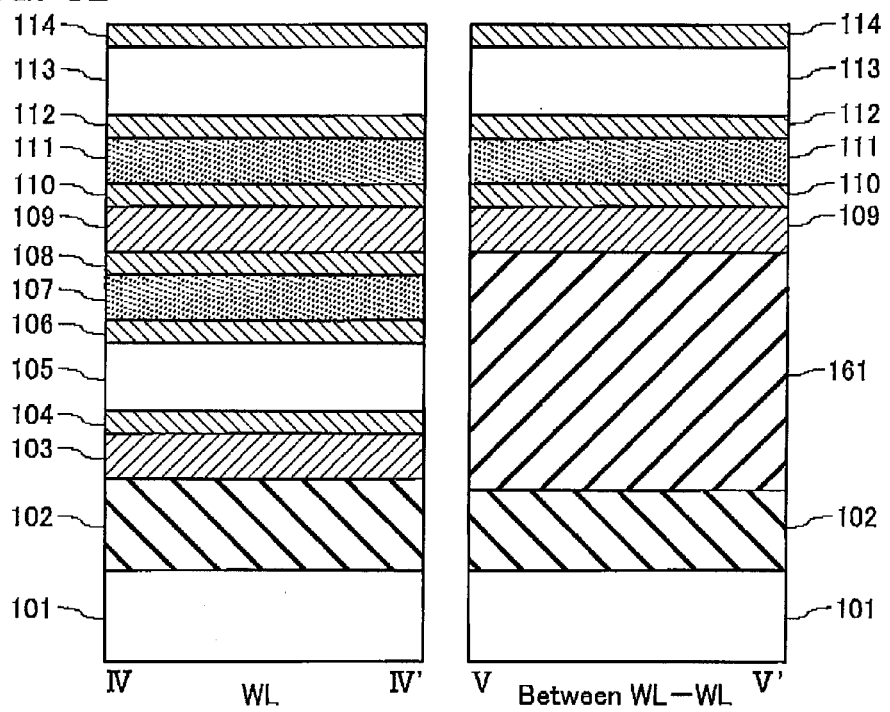

Subsequently, as shown in FIGS. 8A, 8B, on the layer 108 and the first interlayer film 161 after they are planarized by CMP, a second wiring layer 109 of tungsten or the like to be turned to the bit line BL1 is deposited, and then, as the material of the second memory cell MC', a layer 110 to be turned to the fourth electrode EL3', a layer 111 to be turned to the variable resistive element VR', a layer 112 to be turned to the fifth electrode EL2', a layer 113 to be turned to the non-ohmic element NO', and a layer 114 to be turned to the sixth electrode EL1' are deposited in turn to form a second memory cell layer.

Figure 9A:
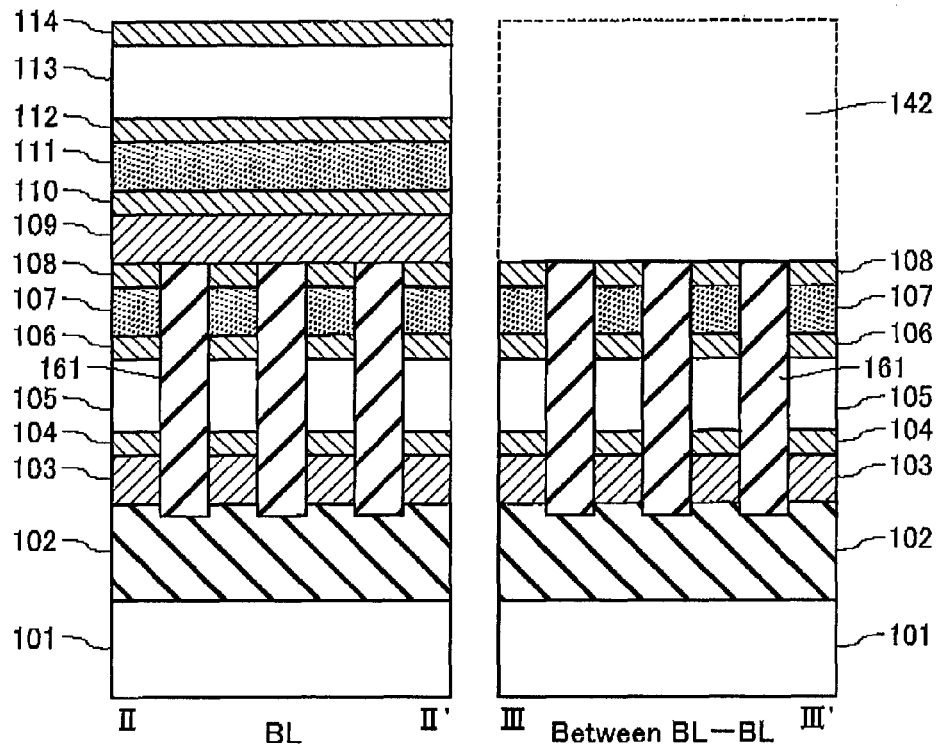
FIGS. 9A and 9B are cross-sectional view showing the step of forming the memory cell array in the semiconductor memory in order of process.
Figure 9B:
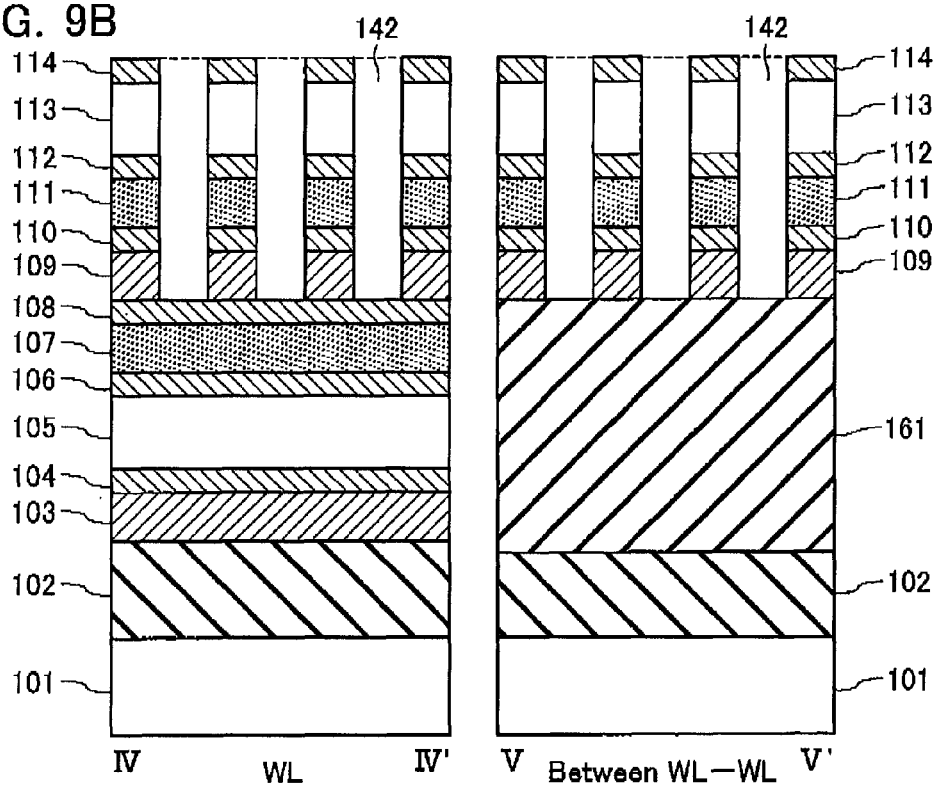

Subsequently, a hard mask of TEOS or the like is formed on the layer 114. Then, as shown in FIGS. 9A, 9B, with a certain L/S in a direction orthogonal to the direction of the first anisotropic etching, a second anisotropic etching by RIE or the like is executed down in depth to the upper surface of the layer 108 to be turned to the third electrode EL3 and the first interlayer film 161, thereby forming second trenches 142 along the bit lines BL1 to separate the layers 114-109 in the word line WL direction.

Figure 10A:
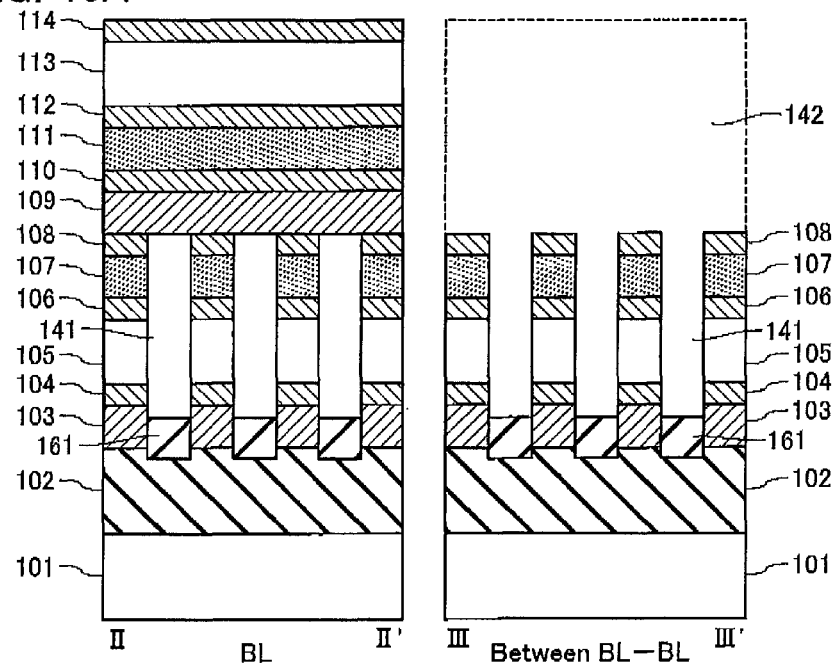
FIGS. 10A and 10B are cross-sectional view showing the step of forming the memory cell array in the semiconductor memory in order of process.
Figure 10B:
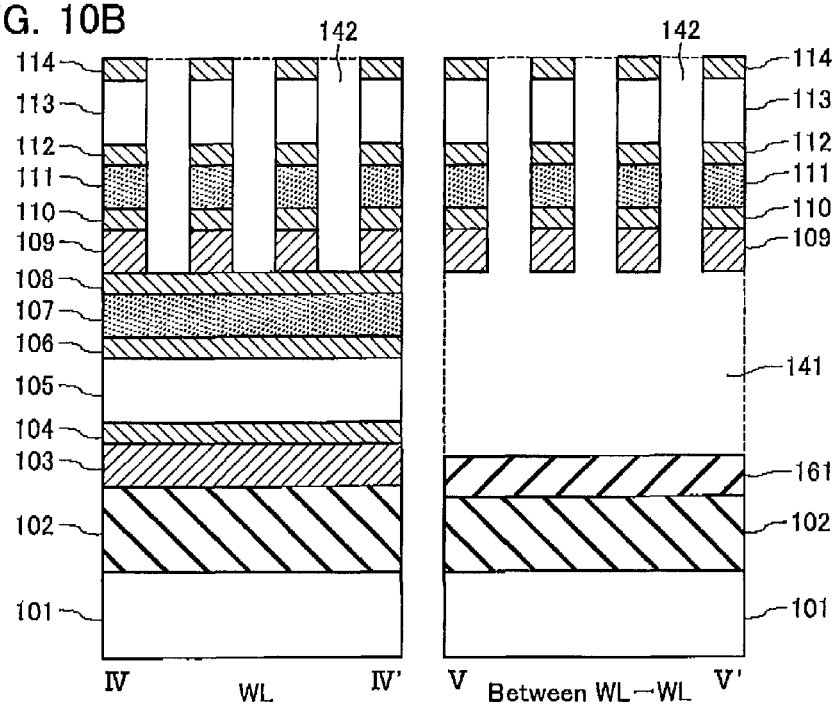

Subsequently, as shown in FIGS. 10A, 10B, ashing is applied (ashing condition: 20 mTorr pressure, 1200 W power supplied, 0 W bias, 180 sccm $O_2$, for example) to remove the first interlayer film 161 exposed from beneath to the second trenches 142 so that it reaches at least the upper surface of the layer 103 to be turned to the word lines WL1 beneath the second trenches 142. The removal of the first interlayer film 161 may be executed by an isotropic wet etching instead of ashing or by a combination of wet etching and ashing. In the case of wet etching, a wet solution may include a thinner organic solvent or an aqueous solution of TMAH (tetramethylammonium hydride) or the like. In this case, the first interlayer film 161 is partly left around at a height lower than the upper surface of the layer 103 to be turned to the word lines WL1, thereby preventing RIE in the later step from damaging the silicon substrate 101. As for the first interlayer film 161 located beneath and between the second trenches 142, the portions exceeding the upper surface of the layer 103 to be turned to the word lines WL1 may be left.

Figure 11A:
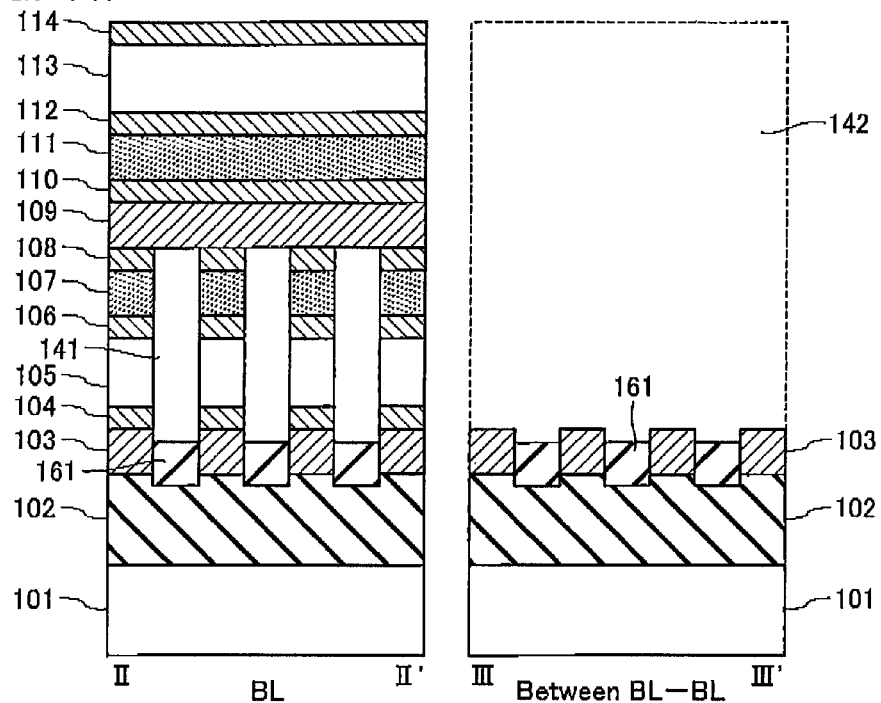
FIGS. 11A and 11B are cross-sectional view showing the step of forming the memory cell array in the semiconductor memory in order of process.
Figure 11B:
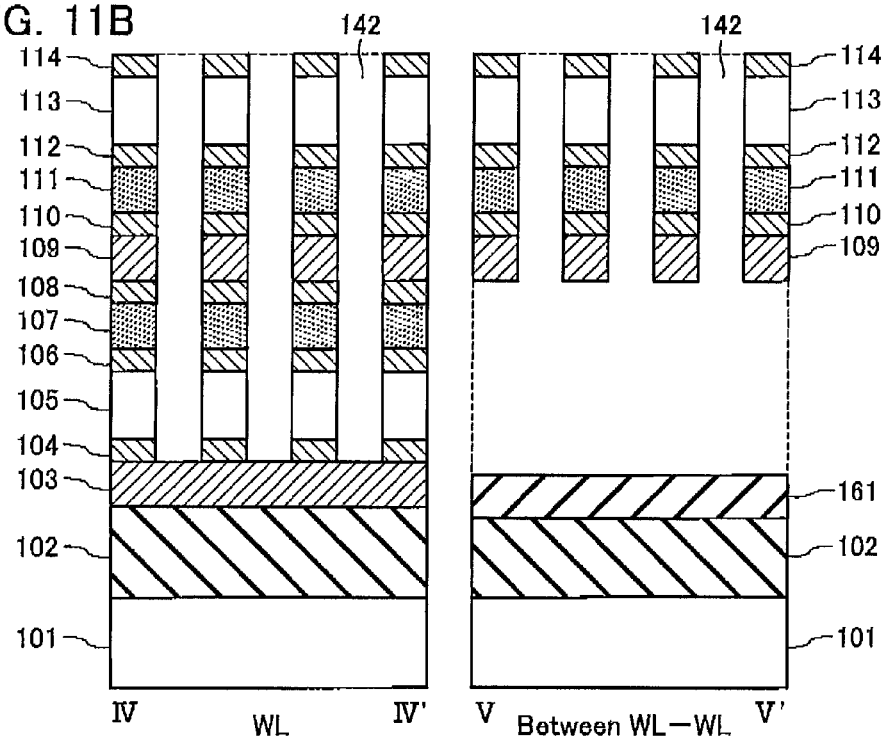

Subsequently, as shown in FIGS. 11A, 11B, the second trenches 142 are dug further to the upper surface of the layer 103 in depth by a third anisotropic etching in the same direction as the second anisotropic etching. As a result, lower memory cells MC separated in the shape of pillars are formed in a self-aligned manner at the cross-points of the word lines WL1 and the bit lines BL1 from the layer 104 to the layer 108.

In this case, ashing may be executed successively after RIE (in situ) to remove the residue of the first interlayer film 161 sufficiently.

Figure 12A:
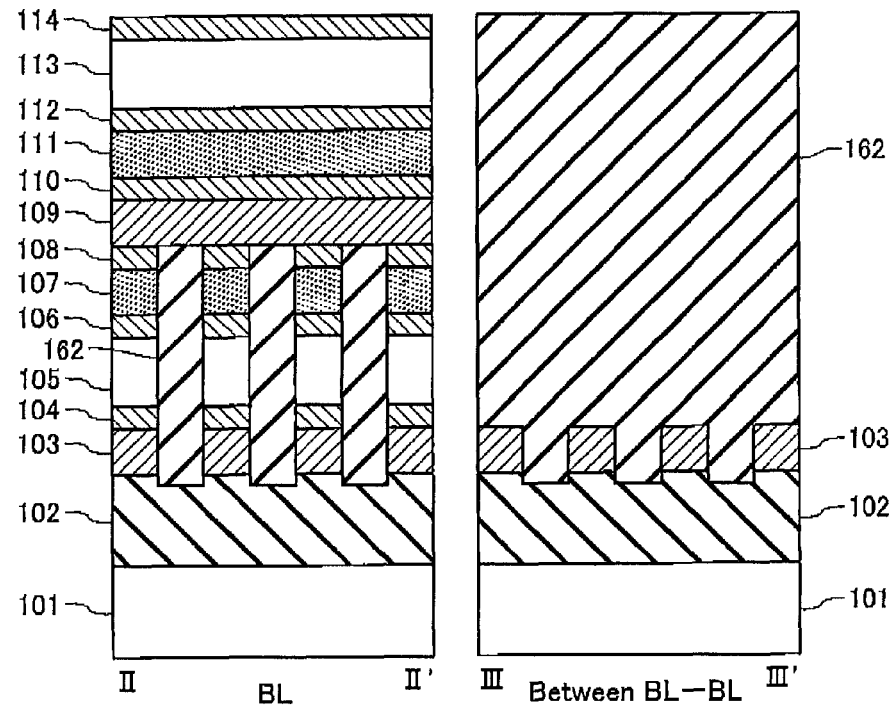
FIGS. 12A and 12B are cross-sectional view showing the step of forming the memory cell array in the semiconductor memory in order of process.
Figure 12B:
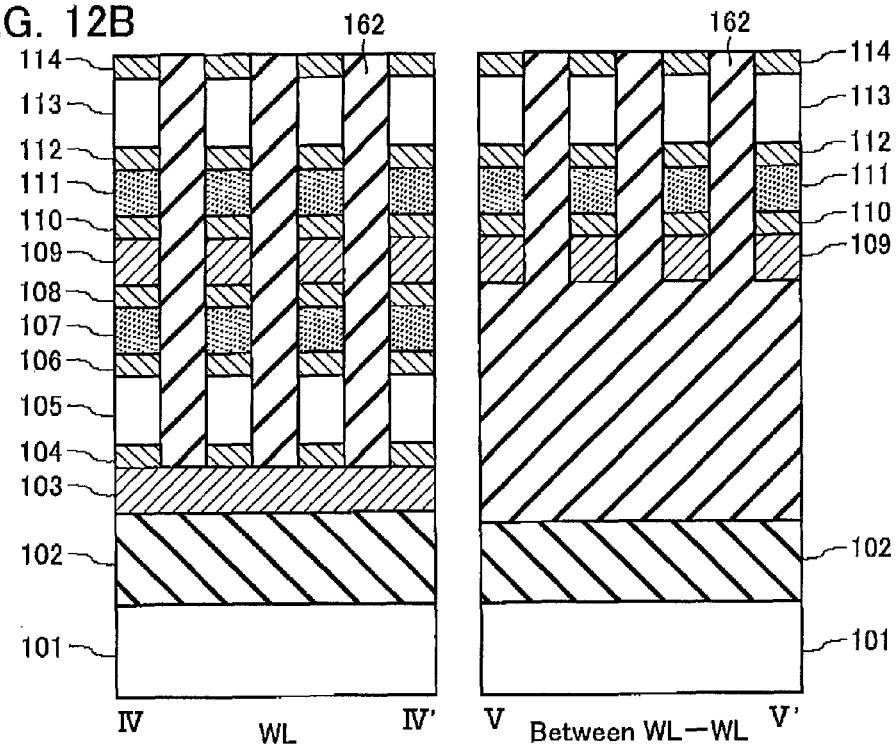

Subsequently, as shown in FIGS. 12A, 12B, a coating method or the like is used to fill the second trenches 142 with a second interlayer film 162 of the same quality as the first interlayer film 161. In this case, at the portion of the first trench 141 located between the second trenches 142, at least part of an air gap caused after removal of the first interlayer film 161 by ashing or wet etching may be filled with the second interlayer film 162. Subsequently, planarization by CMP or the like is executed to remove extra portions from the second interlayer film 162 and expose the layer 114 to be turned to the sixth electrode EL1'.

Figure 13A:
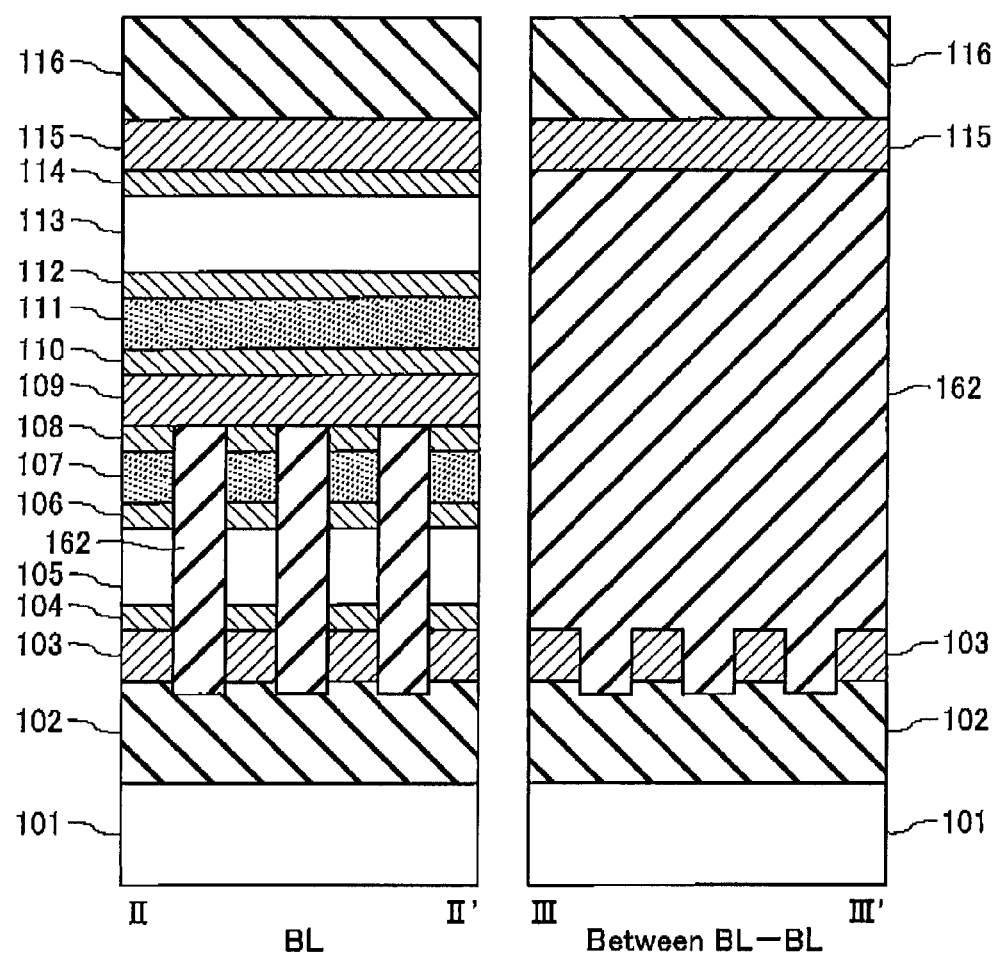
FIGS. 13A and 13B are cross-sectional views showing the step of forming the memory cell array in the semiconductor memory in order of process.
Figure 13B:
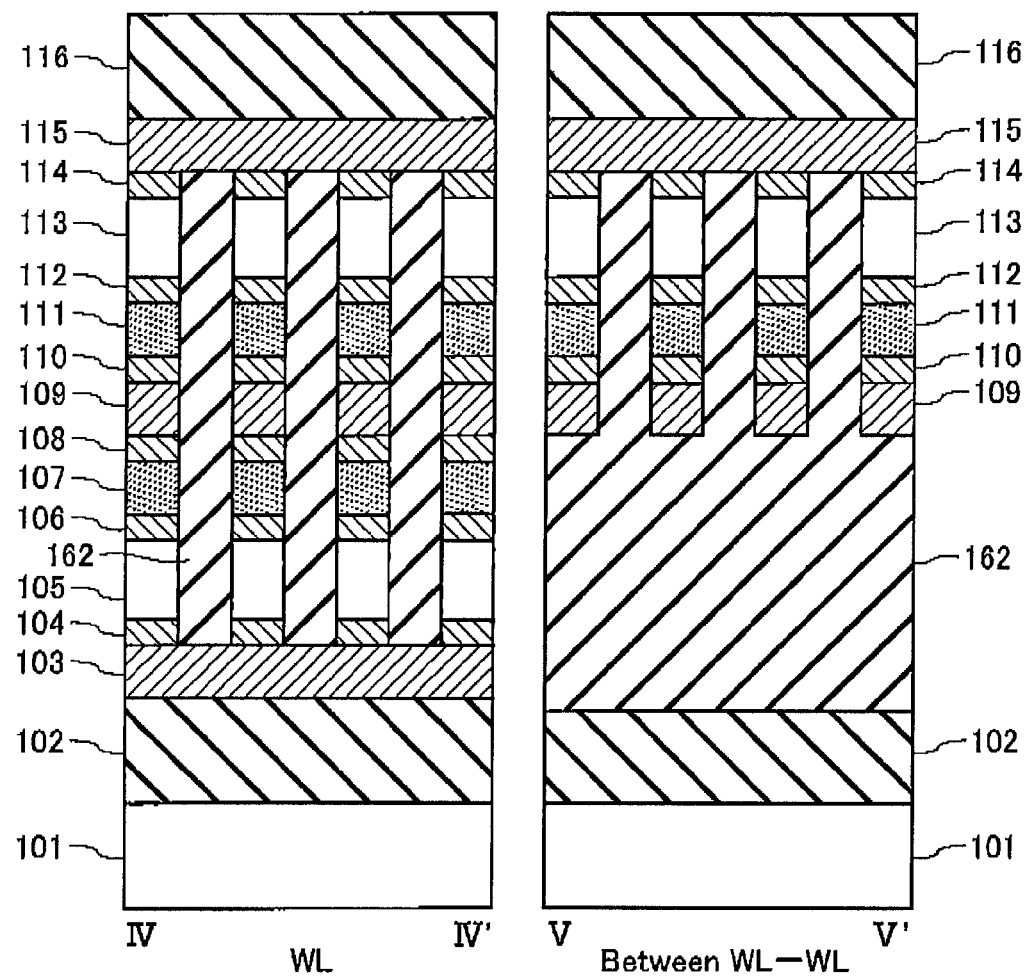

Subsequently, as shown in FIGS. 13A, 13B, on the layer 114 and the second interlayer film 162 after they are planarized by CMP, a third wiring layer 115 of tungsten or the like to be turned to the word lines WL2 and a TEOS film 116 are deposited.

Figure 14A:
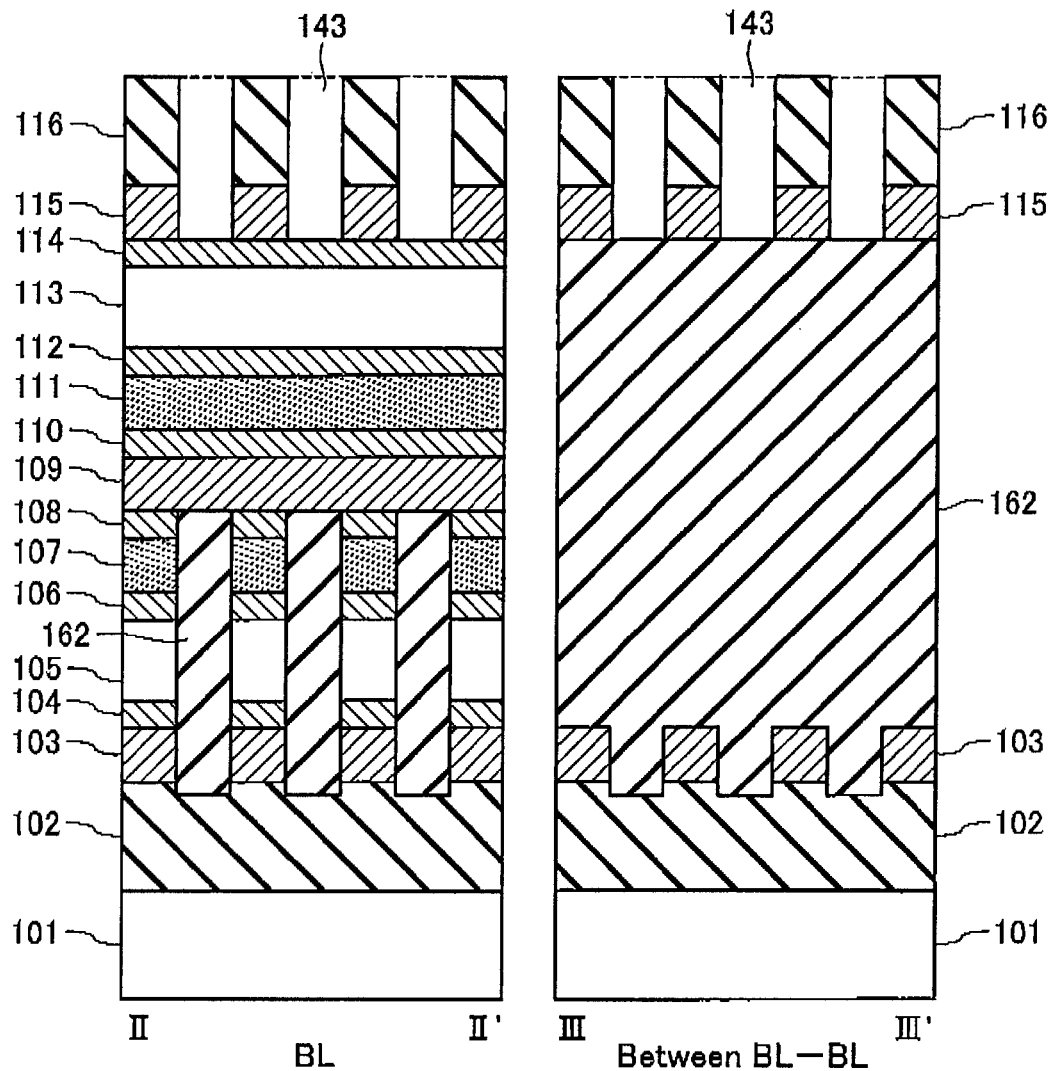
FIGS. 14A and 14B are cross-sectional views showing the step of forming the memory cell array in the semiconductor memory in order of process.
Figure 14B:
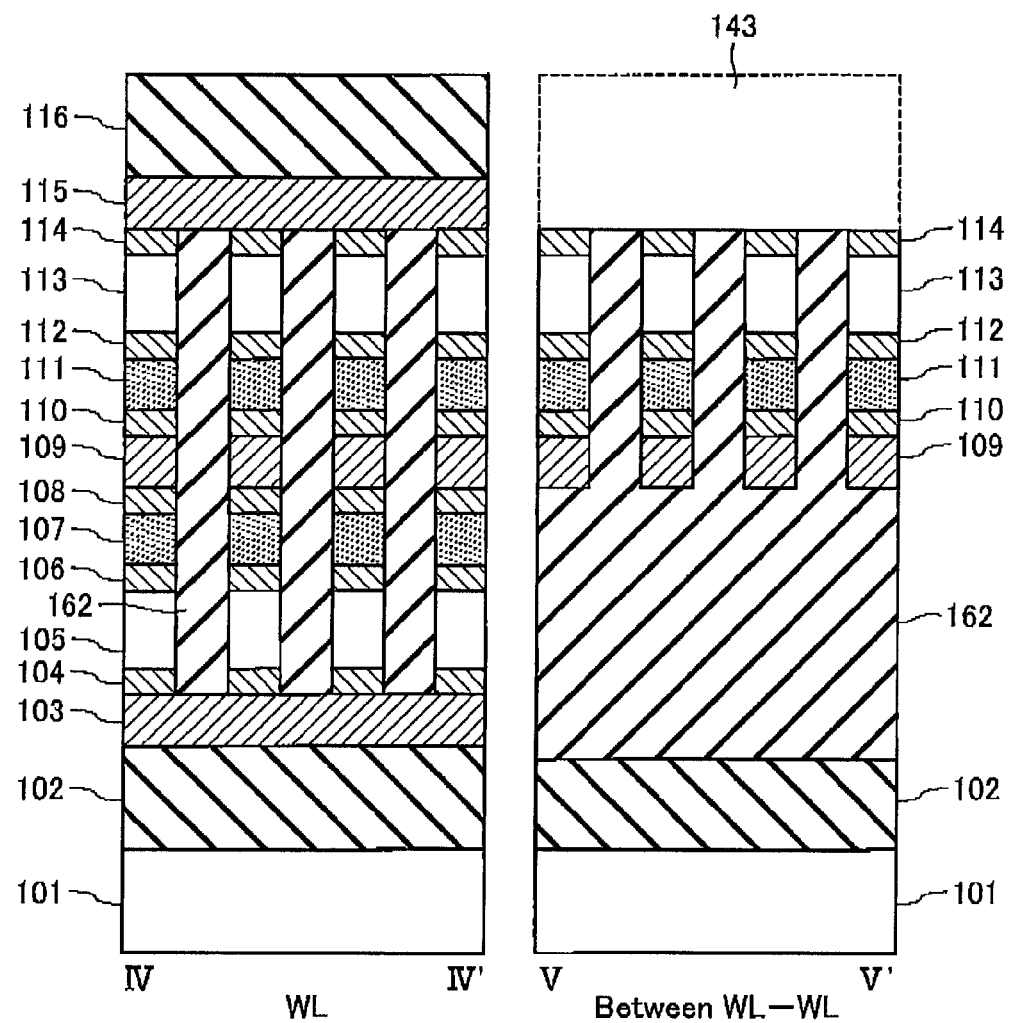

Subsequently, as shown in FIGS. 14A, 14B, with an L/S in the same direction as the first anisotropic etching, a fourth anisotropic etching is applied to form third trenches 143 reaching the upper surface of the layer 114 and the second interlayer film 162 in depth.

Figure 15A:
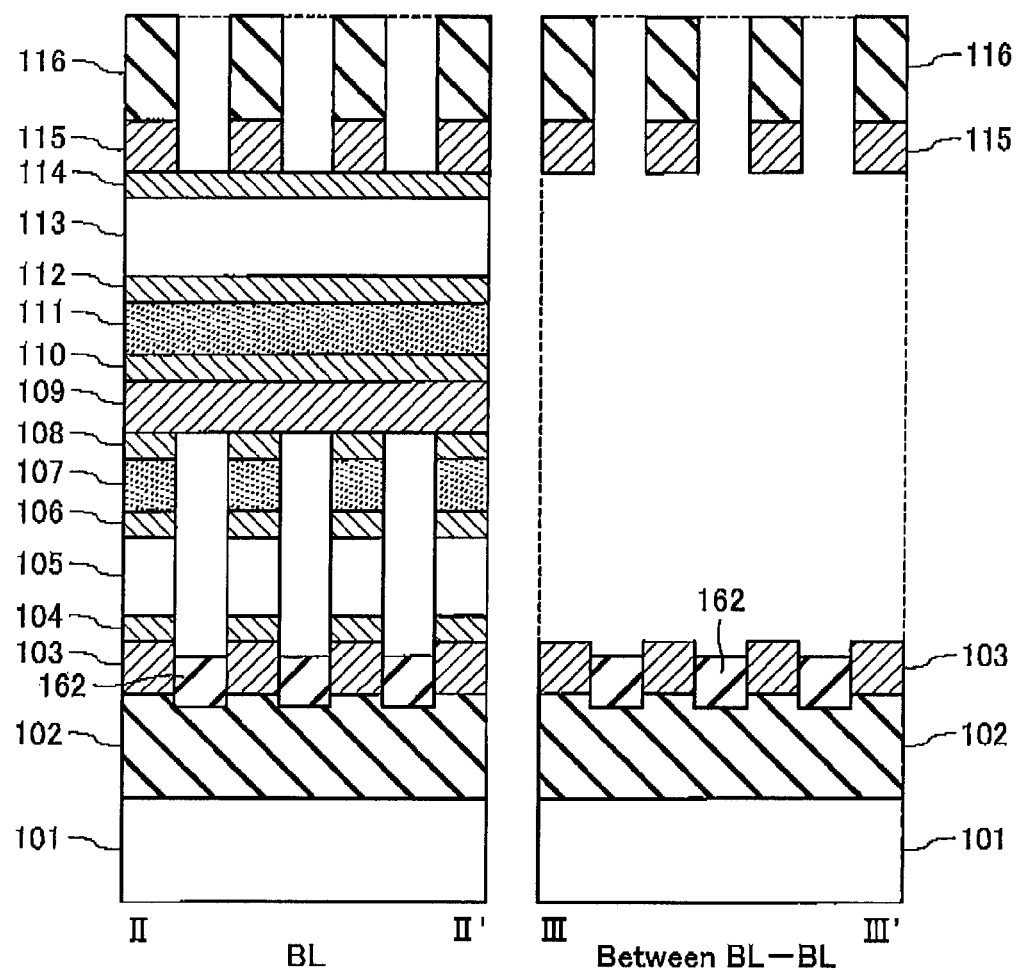
FIGS. 15A and 15B are cross-sectional views showing the step of forming the memory cell array in the semiconductor memory in order of process.
Figure 15B:
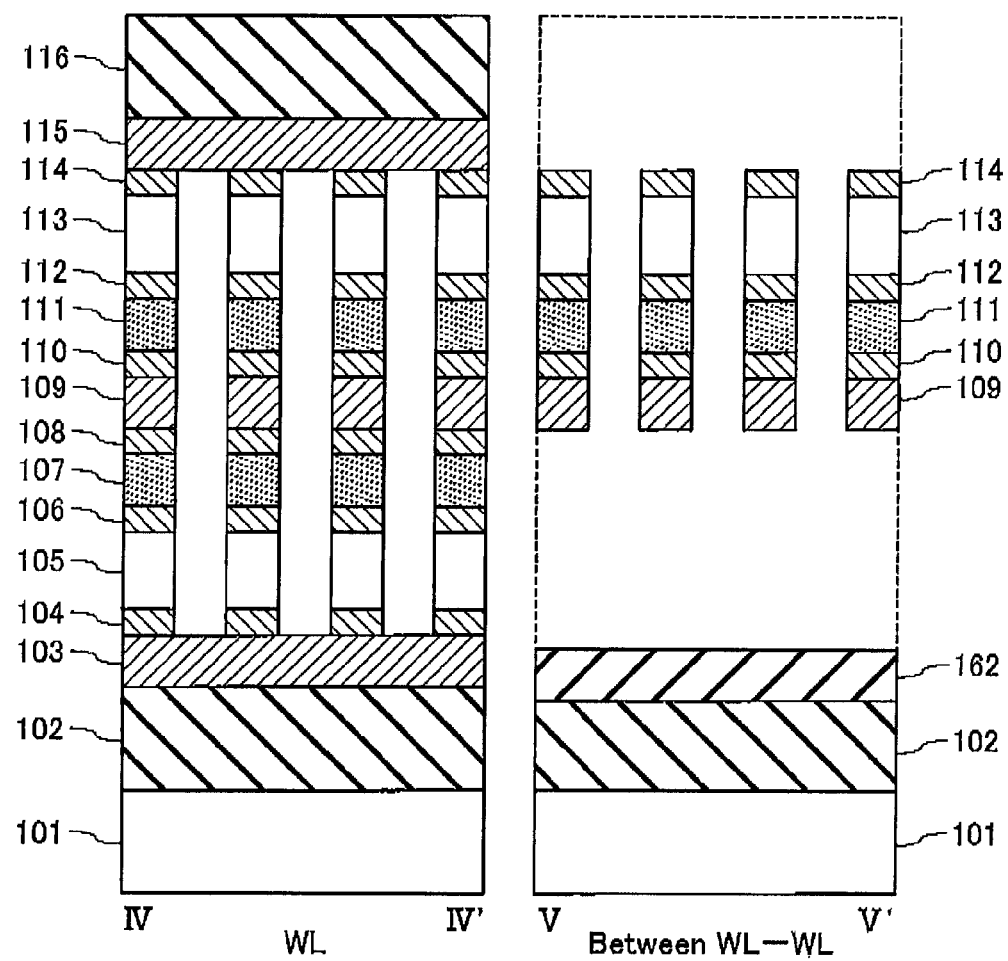

Subsequently, as shown in FIGS. 15A, 15B, similar ashing or wet etching to that for the removal of the first interlayer film 161 is applied to remove the second interlayer film 162 exposed to the third trenches 143 at least to the upper surface of the layer 109 to be turned to the bit lines BL1 beneath the third trenches 143. Also in this case, part of the second interlayer film 162 is left from the viewpoint of preventing damage to the foundation.

Figure 16A:
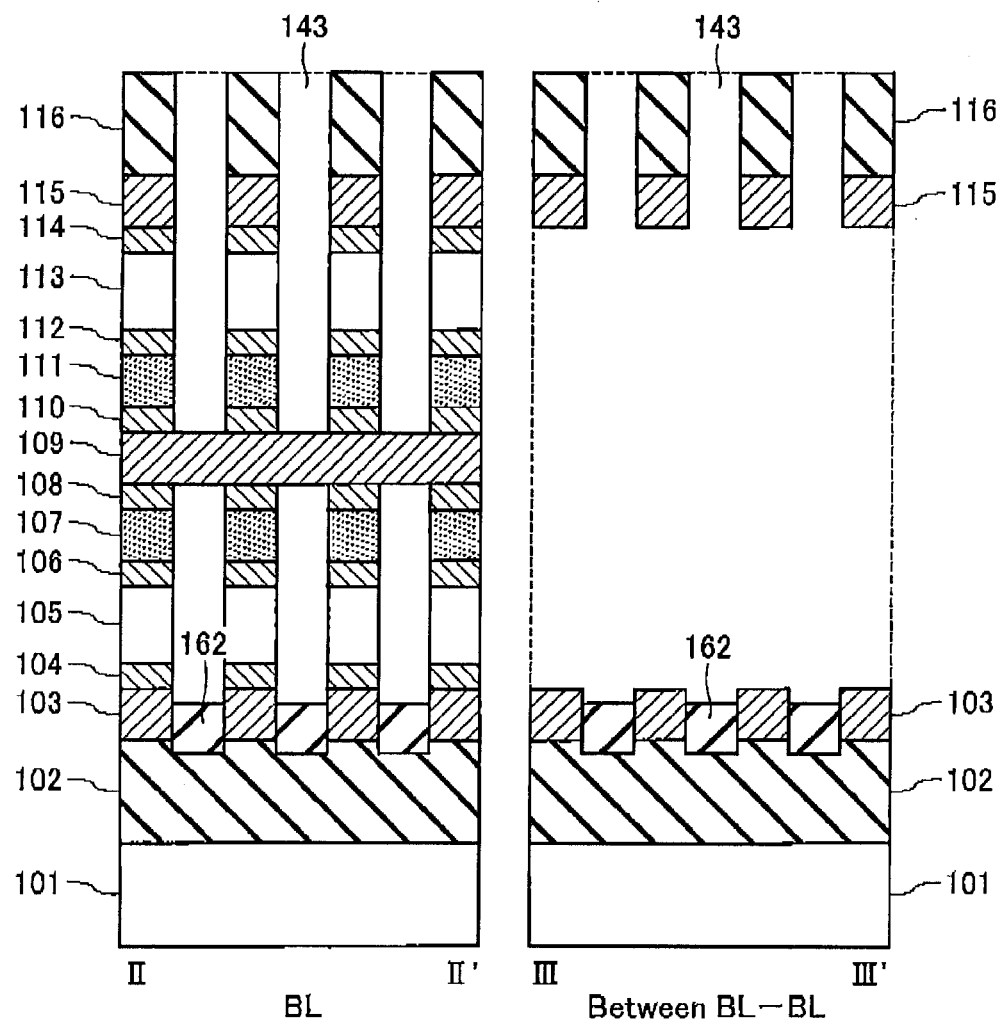
FIGS. 16A and 16B are cross-sectional view showing the step of forming the memory cell array in the semiconductor memory in order of process.
Figure 16B:
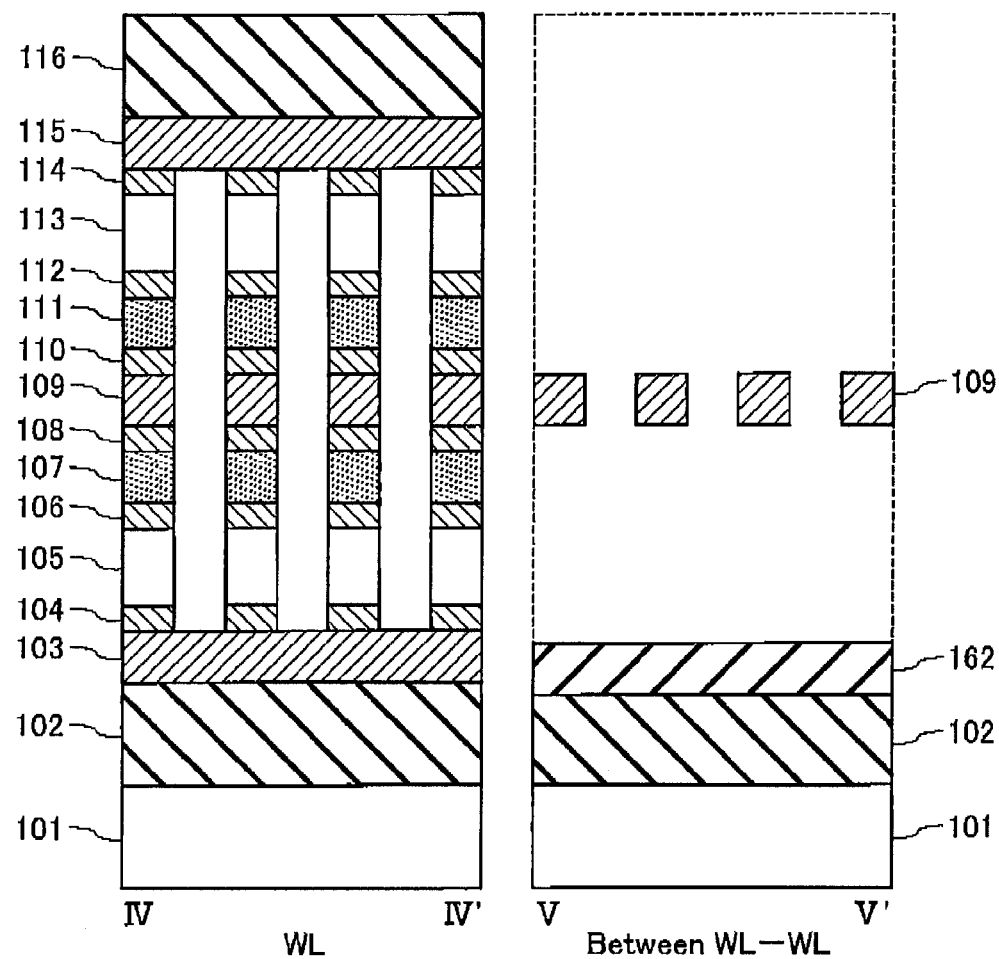
Figure 17A:
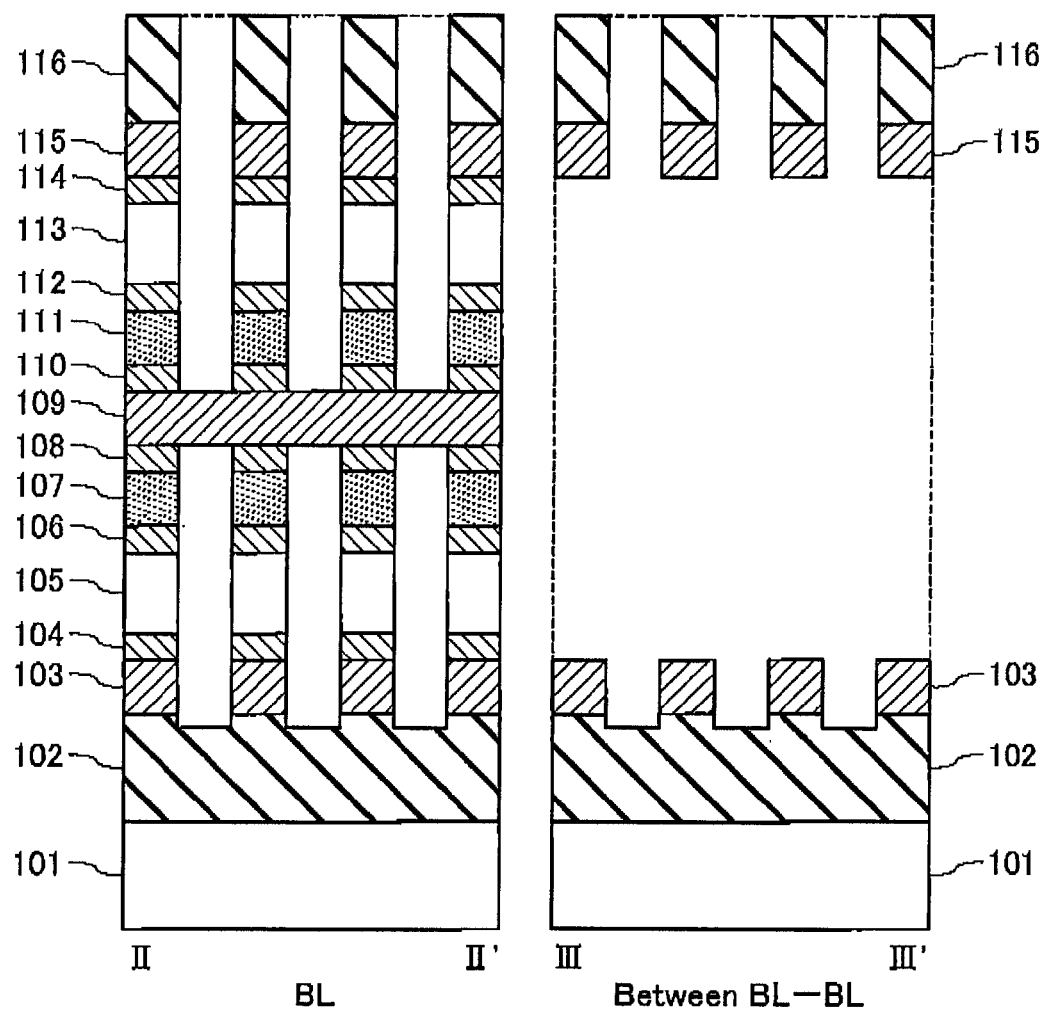
FIGS. 17A and 17B are cross-sectional view showing the step of forming the memory cell array in the semiconductor memory in order of process.
Figure 17B:
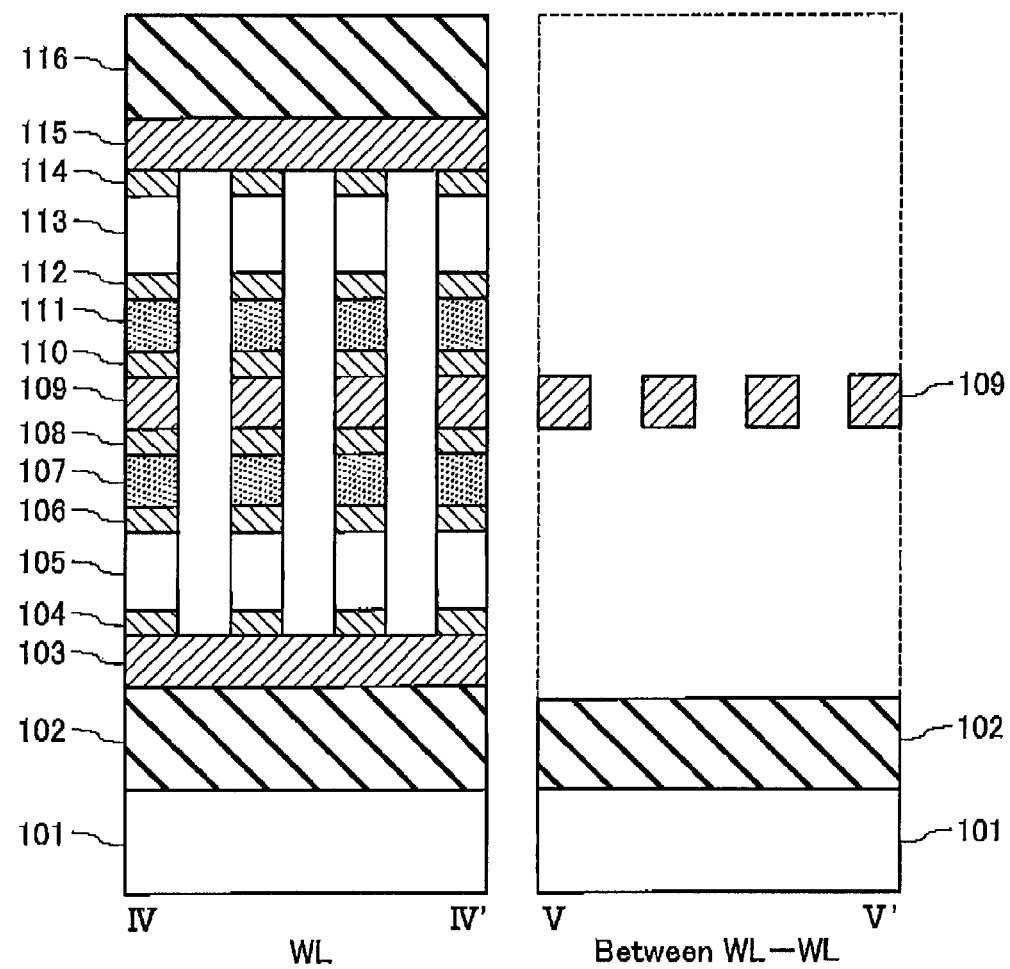

Subsequently, as shown in FIGS. 16A, 16B, the third trenches 143 are dug further to the upper surface of the layer 109 in depth by a fifth anisotropic etching in the same direction as the fourth anisotropic etching. As a result, upper memory cells MC' separated in the shape of pillars are formed in a self-aligned manner at the cross-points of the bit lines BL1 and the word lines WL2 from the layer 110 to the layer 114.

Finally, as shown in FIGS. 17A, 17B, ashing may be executed successively after RIE (in situ) to remove the residue of the second interlayer film 162 sufficiently. In this case, it is possible to reduce the capacity between the memory cells MC and prevent the interference between the memory cells MC effectively as described above. If the residues of the first interlayer film 161 and the second interlayer film 162 are removed at the same time in this step, the similar effect can be exerted on prevention of the interference between the memory cells MC without removing the residue of the first interlayer film 161 by ashing after the formation of the lower memory cells MC.

As described above, stacking solid films and patterning with mutually orthogonal L/Ss results in a memory cell array of the cross-point type formed in a self-aligned manner with no misalignment with lines.

Figure 18:
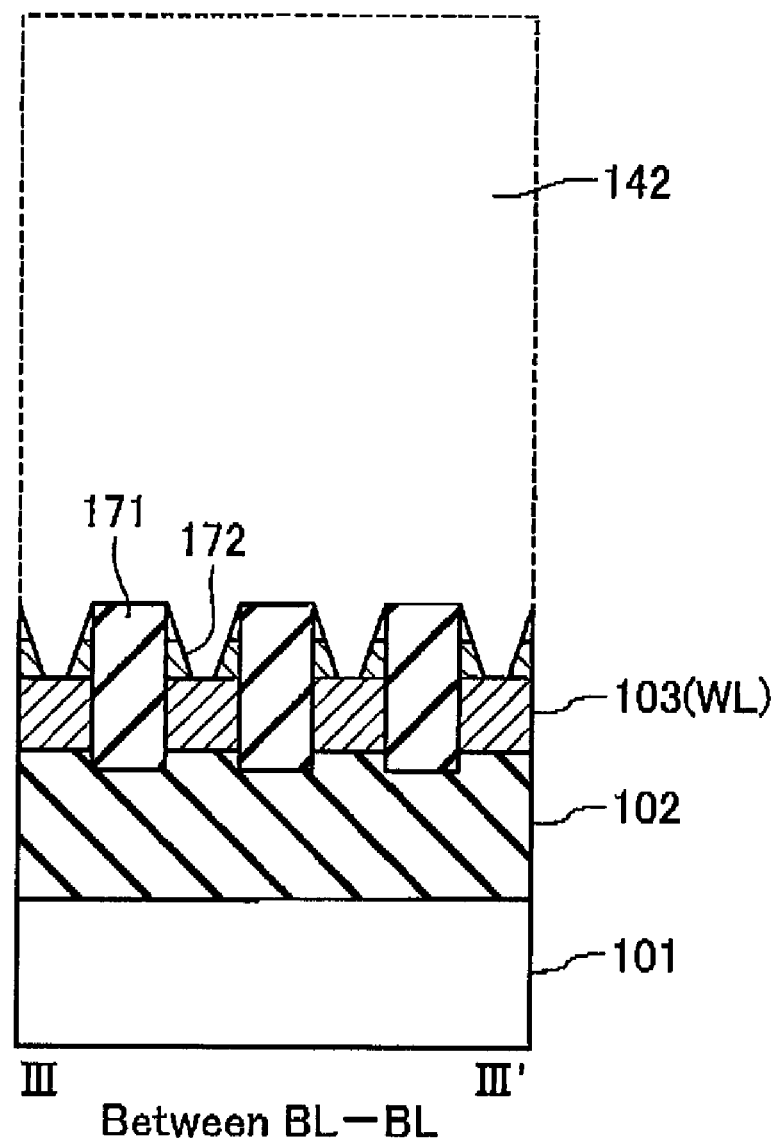
FIG. 18 is a cross-sectional view showing a memory cell array in the bit line direction during formation through a method of manufacturing a semiconductor memory device according to a reference example.

In this connection, as shown in FIG. 18, if an anisotropic etching is applied to remove an interlayer insulator film 171 of $SiO_2$ and the memory cell material at the same time, the interlayer insulator film 171 resides and leaves the residue 172 of the memory cell material at the lower portion of the side wall because it is difficult to achieve a selection ratio of 1:1 between $SiO_2$ and the memory cell material. In this case, a short may possibly be caused between adjacent memory cells along the word line WL.

With this regard, in the present embodiment, at the time of forming memory cells in the shape of pillars, the interlayer film is removed to the level lower than the upper surface of the lower line isotropically, followed by anisotropic etching. Therefore, it is possible to prevent the residue from arising to cause a short between the memory cells along the lower line, and thus it is possible to execute processing with no need for achieving a matched selection ratio between the memory cell material and the interlayer film.

Second Embodiment

Figure 19:
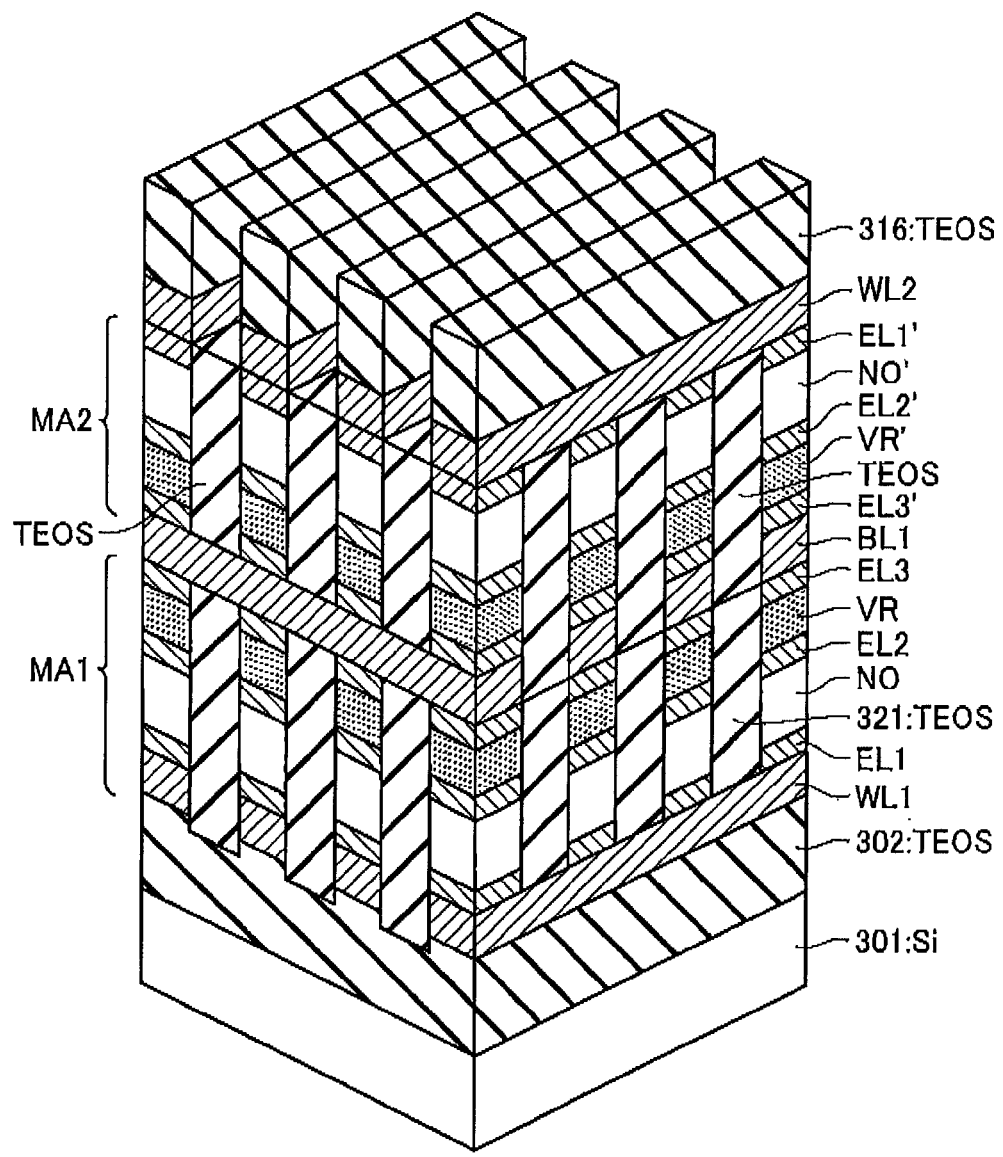
FIG. 19 is a perspective view showing part of a memory cell array in a semiconductor memory according to a second embodiment of the present invention.

FIG. 19 is a perspective view showing part of a memory cell array in a semiconductor memory according to a second embodiment of the present invention.

This memory cell array has the same structure in word lines WL, bit lines BL and memory cells MC shown in FIG. 4 though it includes TEOS films formed as interlayer insulator films between adjacent word lines WL, bit lines BL and memory cells.

In the case of the first embodiment, if the organic film comprises a carbon-based material with lower insulation than an inorganic oxide film or the like, it is desired to remove the organic film sufficiently. In this case, however, air gaps arise between adjacent lines (wirings) and between memory cells, and accordingly the physical strength of the semiconductor memory weakens. This may possibly be a problem in particular in the periphery of the cell array layer having no cross-point coupled via memory cells.

With this regard, the formation of the interlayer insulator films between word lines WL, bit lines BL and memory cells MC as shown in FIG. 19 improves the physical strength over the first embodiment.

The following description is given to a method of manufacturing the memory cell array of the double-layered structure shown in FIG. 19.

For the purpose of forming transistors and so forth contained in necessary peripheral circuits on a silicon substrate 301, a FEOL process is executed first, and then a TEOS film 302 is deposited thereon. At this time, vias, not shown, are formed as well.

Subsequently, the upper part, including a first wiring layer 303 to be turned to the word lines WL1 and subsequent portions, is formed.

FIGS. 20-27 are perspective views showing the steps of forming the upper part in order of process.

Figure 20:
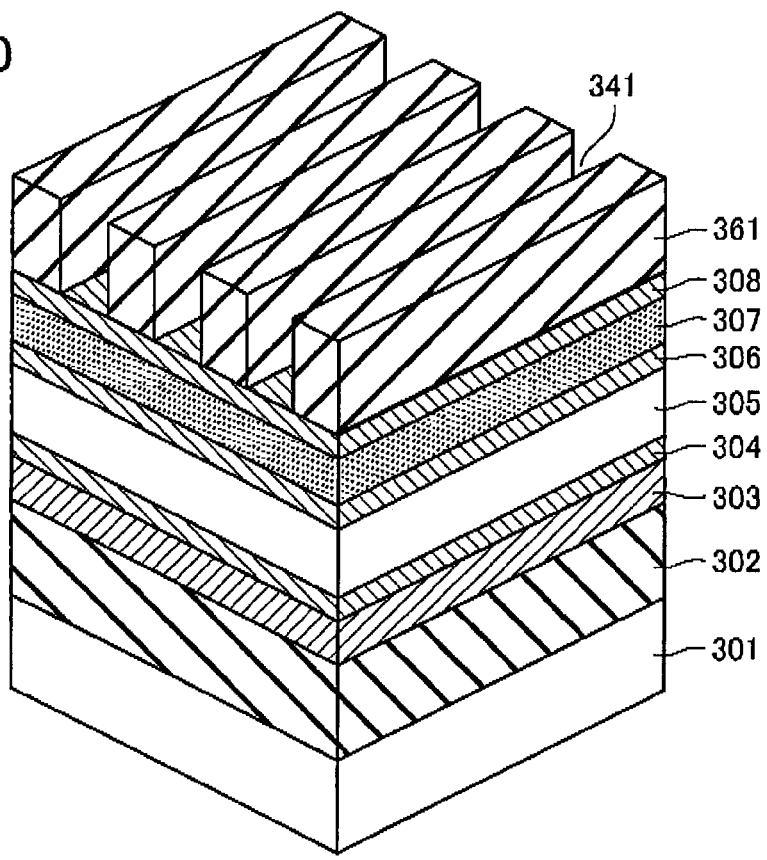
FIG. 20 is a perspective view showing the step of forming the memory cell array in the semiconductor memory in order of process.

As described above, after the TEOS film 302 and the vias are formed, the first wiring layer 303 to be turned to the word line WL1 is deposited thereon, and then, as the material of the first memory cell, a layer 304 to be turned to the first electrode EL1, a layer 305 to be turned to the non-ohmic element NO, a layer 306 to be turned to the second electrode EL2, a layer 307 to be turned to the variable resistive element VR, and a layer 308 to be turned to the third electrode EL3 are deposited in turn to form a first memory cell layer. Further, a certain L/S hard mask 361 having first trenches 341 extending in the first direction, that is, in the word line WL1 direction is formed thereon. Through the above steps, a stacked structure shown in FIG. 20 is formed.

Figure 21:
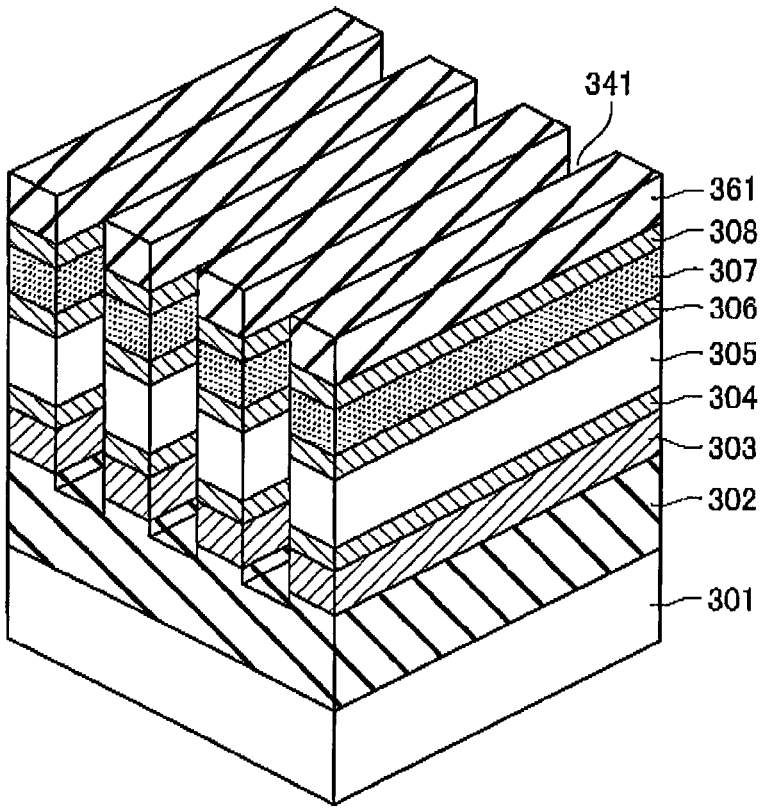
FIG. 21 is a perspective view showing the step of forming the memory cell array in the semiconductor memory in order of process.

Subsequently, a first anisotropic etching such as RIE is applied to form first trenches 341 along the word line WL1 to separate the first memory cell layer as shown in FIG. 21.

Figure 22:
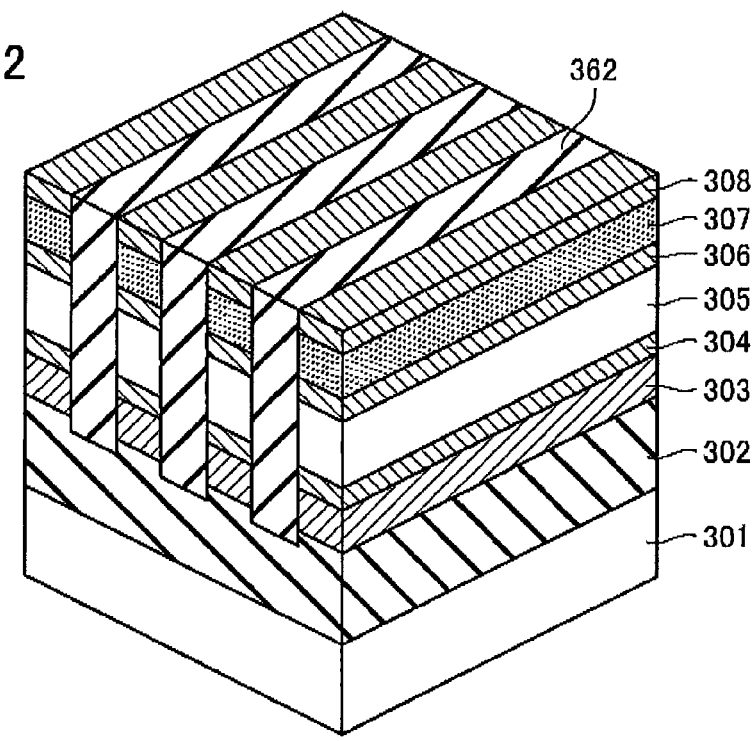
FIG. 22 is a perspective view showing the step of forming the memory cell array in the semiconductor memory in order of process.

Subsequently, as shown in FIG. 22, a coating method or the like is used to fill the first trenches 341 with an organic interlayer film 362 such as a carbon film having a higher etching selection ratio to the memory cell material. Subsequently, planarization by CMP or the like is executed to remove extra portions from the interlayer film 362 and expose the layer 308 to be turned to the third electrode EL3 to form a first stacked body filled with the interlayer film 362.

Figure 23:
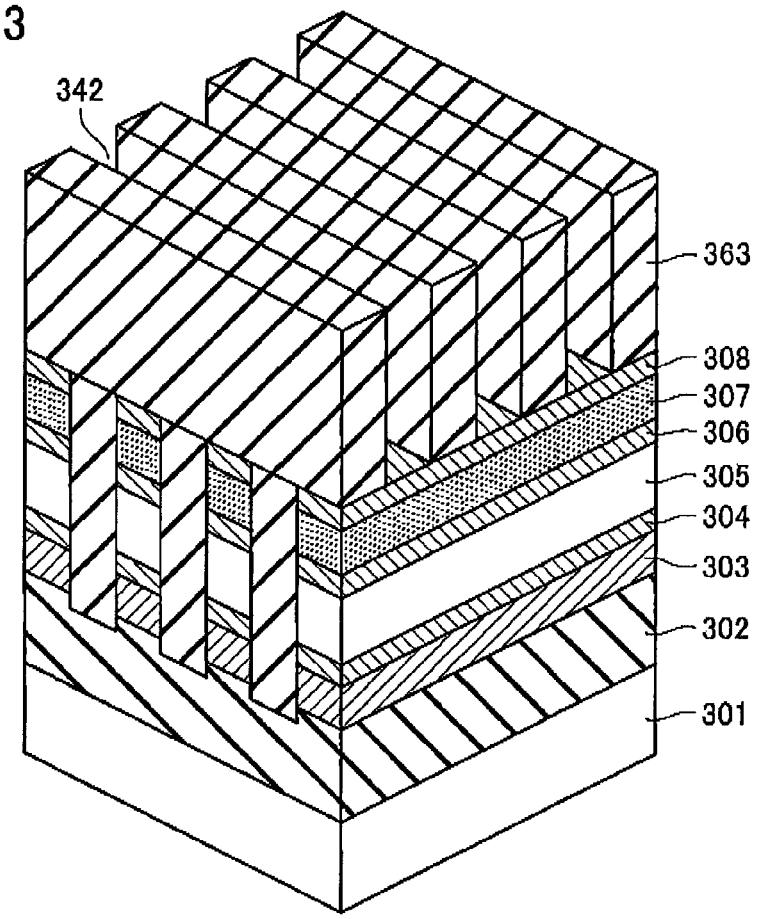
FIG. 23 is a perspective view showing the step of forming the memory cell array in the semiconductor memory in order of process.

Subsequently, as shown in FIG. 23, on the first stacked body, a certain L/S, first sacrifice layer, that is, a resist 363 having second trenches 342 extending in the bit line BL direction is formed. For example, in the case of S-MAP (Stacked MAsk Process), a multilayered resist composed of a photo-resist/an inorganic film such as a spin-on-glass/a carbon-containing film such as a spun-on C film in a stacked form is processed for forming the second trenches 342. At this time, the pattern of the photo-resist is transferred to the inorganic film, and the pattern of the inorganic film is transferred to the carbon-containing film to form the resist 363 shown in FIG. 23. In the step of etching the carbon-containing film, the photo-resist is also etched, and a certain L/S, first sacrifice layer is obtained as a multilayered film including at least the inorganic film and the carbon-containing film. In addition, as the interlayer film 362 comprises the same organic film, portions of the interlayer film 362 exposed after removal of the carbon-containing film by etching and thus not covered with the resist 363 are backed as well.

Figure 24:
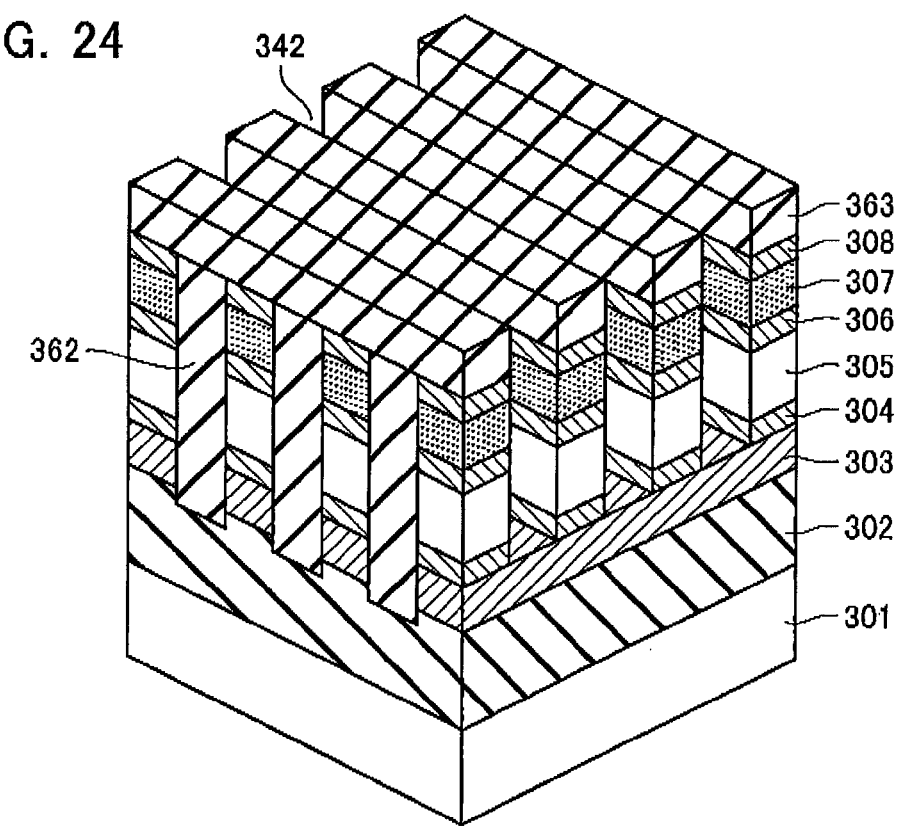
FIG. 24 is a perspective view showing the step of forming the memory cell array in the semiconductor memory in order of process.
Figure 25:
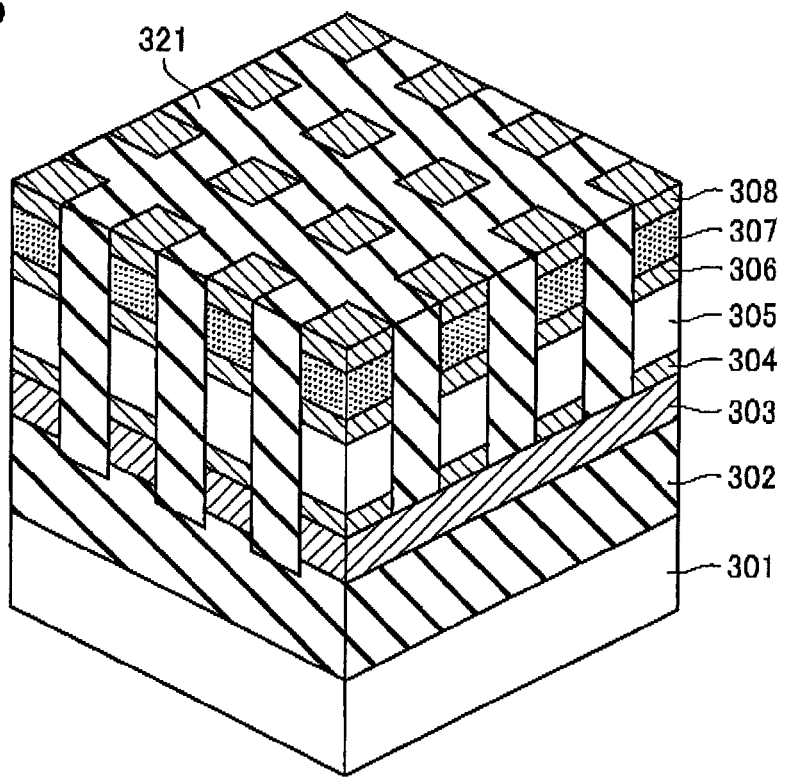
FIG. 25 is a perspective view showing the step of forming the memory cell array in the semiconductor memory in order of process.

Subsequently, as shown in FIG. 24, a second anisotropic etching by RIE or the like is executed down to the upper surface of the word line WL1 in depth with a certain L/S in the second direction orthogonal to the word line WL direction, thereby forming second trenches 342 along the bit line BL1 in the first memory cell layer to separate the layers 308-304 in the word line WL direction. At this time, as the interlayer film 362 between the memory cells adjoining along the trench 342 has been backed, the second anisotropic etching can be executed substantially in consideration of only the memory cell material. In the above embodiment, prior to the second anisotropic etching, the portion not covered with the multi-layered resist 363 is backed. Instead of using such the method, the interlayer film may be controlled to have a higher etching selection ratio to the material of the memory cell layer at the time of the second anisotropic etching to etch the memory cell layer and the interlayer film by the same process of the second anisotropic etching.

Subsequently, the resist 363 and the interlayer film 362 are removed. Thereafter, a first interlayer insulator film 321 of TEOS or the like is formed in the trenches 341 and 342, and the upper surfaces of the layer 308 and the interlayer insulator film 321 are planarized by CMP, thereby forming a second stacked body shown in FIG. 25 to this point.

Figure 26:
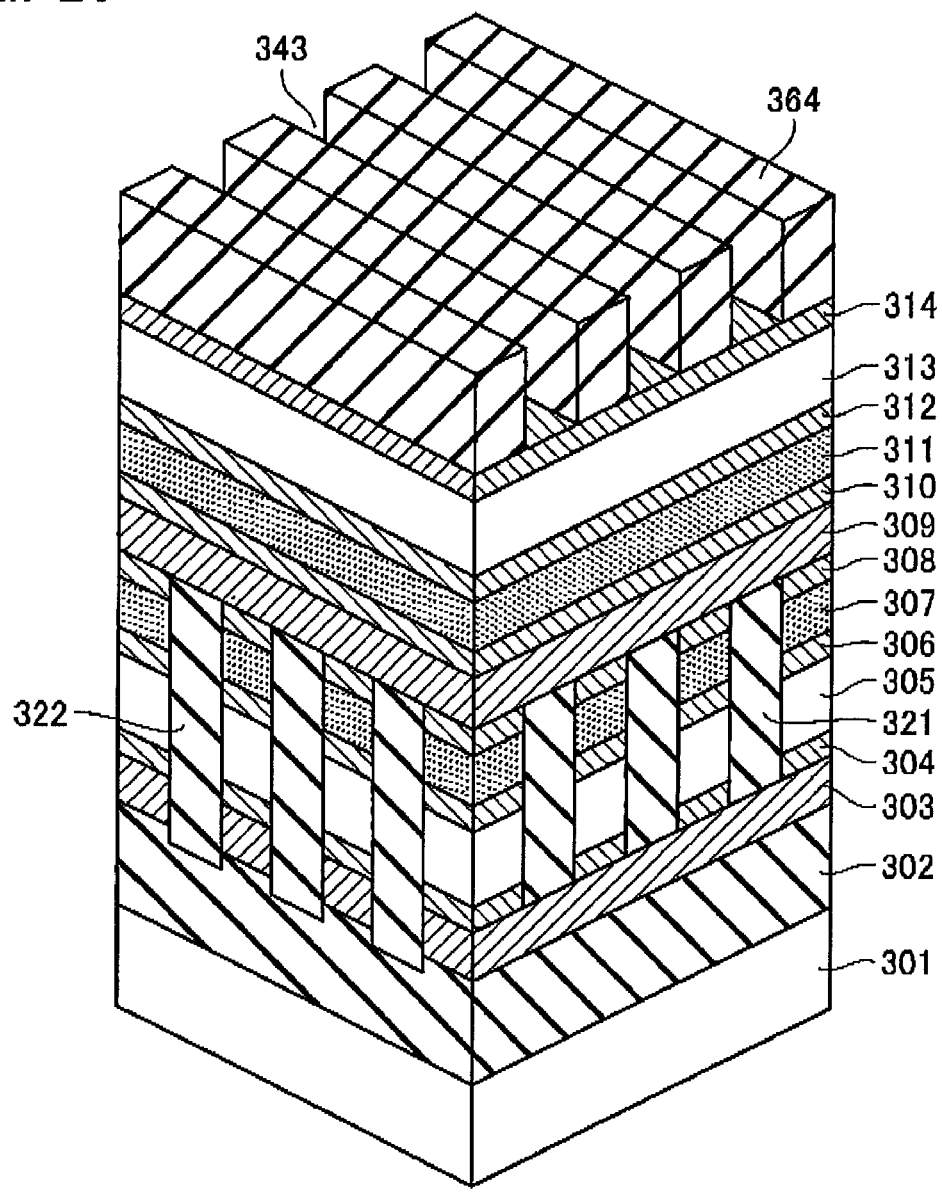
FIG. 26 is a perspective view showing the step of forming the memory cell array in the semiconductor memory in order of process.

Subsequently, as shown in FIG. 26, on the layer 308 and the first interlayer insulator film 321 after they are planarized by CMP, a second wiring layer 309 of tungsten or the like to be turned to the bit line BL1 is deposited, and then, as the material of the second memory cell, a layer 310 to be turned to the fourth electrode EL3', a layer 311 to be turned to the variable resistive element VR', a layer 312 to be turned to the fifth electrode EL2', a layer 313 to be turned to the non-ohmic element NO', and a layer 314 to be turned to the sixth electrode EL1' are deposited in turn to form a second memory cell layer. Thereafter, on the layer 314, a hard mask 364 of TEOS or the like is formed with a certain L/S in the bit line BL direction.

Figure 27:
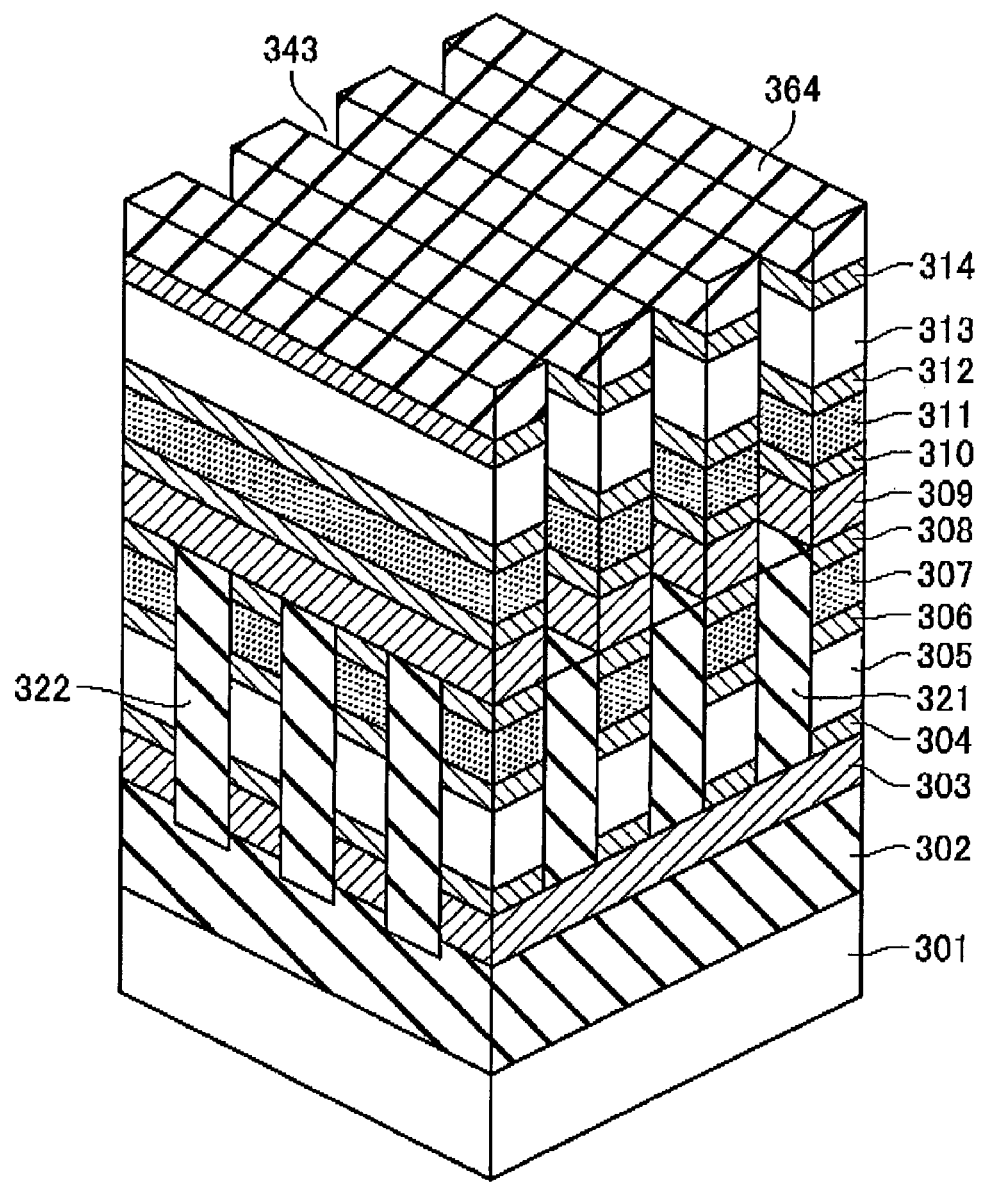
FIG. 27 is a perspective view showing the step of forming the memory cell array in the semiconductor memory in order of process.

Subsequently, as shown in FIG. 27, a third anisotropic etching by RIE or the like is applied through the hard mask 364 down in depth to the lower surface of the layer 309 to be turned to the bit line BL1, thereby forming third trenches 343 along the bit lines BL1 to separate the layers 314-309 in the bit line BL direction.

Subsequently, although not shown, through the same step as the formation of the first layer shown in FIGS. 22-25 and the step of forming the lines in the uppermost layer, a memory cell array of the cross-point type is formed.

Thus, the use of an organic film as the interlayer film makes it possible to achieve an extremely higher etching selection ratio of the interlayer film to the material of the memory cell layer. In a word, substantially, it is possible to form memory cells only with processing the memory cell layer after backing the interlayer film. As a result, the present embodiment makes it possible to prevent the residue of the memory cell material from occurring between adjacent memory cells like in the first embodiment. After removal of the organic film, an interlayer insulator film of TEOS or the like may be formed. In this case, it is possible to provide a semiconductor memory of which physical strength is enhanced over the first embodiment.

Figure 28:
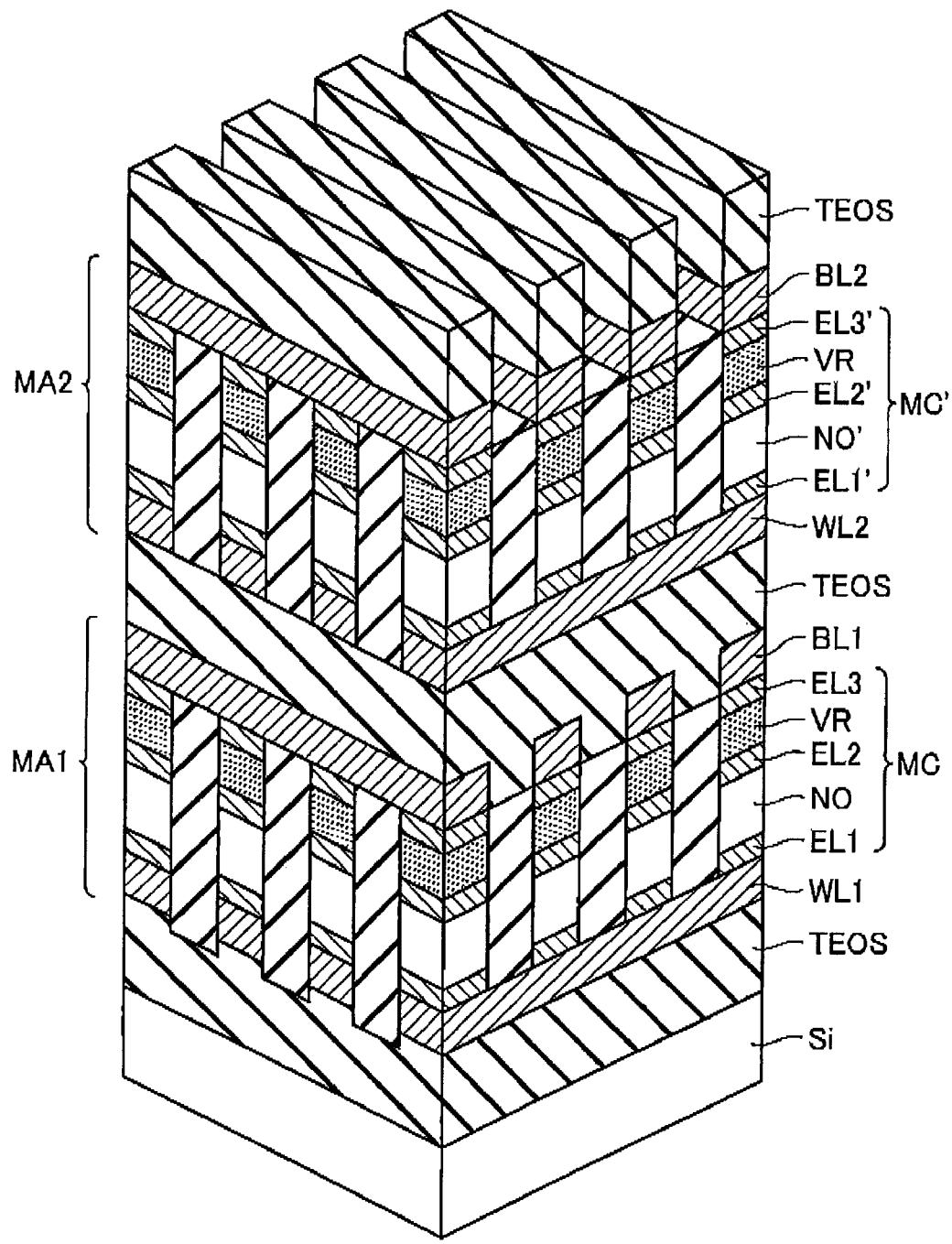
FIG. 28 is a perspective view showing part of a memory cell array in another semiconductor memory according to the present embodiment.

The present embodiment is also applicable to memory cell arrays in which the word line WL and the bit line BL are not shared by the upper and lower cell allay layers MA1, MA2 as shown in FIG. 28.

In this case, the device can be produced by repeating the steps shown in FIGS. 20-25 to form the cell allay layers MA1, MA2 in a stacked form while interposing the steps of forming the bit lines BL1, BL2 and the interlayer insulator film of TEOS or the like in the cell allay layers MA1, MA2.

Other Embodiments

The above embodiments describe the methods of manufacturing memory cell arrays of the double-layered structure. The formation of the stacked structure may be repeated to form a memory cell array of the cross-point type having an arbitrary number of stacked layers. In contrast, a single-layered memory cell array may be produced by omitting the formation of the upper memory cell material.

The present invention is not limited in particular with regard to the structure of memory cells but rather can be applied to various semiconductor memory devices of the cross-point type such as a phase change memory device, an MRAM device, a PFRAM, and an ReRAM.

What is claimed is:

1. A method of manufacturing semiconductor memory device, comprising:
    forming a first wiring layer above a semiconductor substrate;
    forming a first memory cell layer above said first wiring layer, said first memory cell layer being arranged to configure first memory cells therein;
    forming a plurality of first trenches in said first wiring layer and said first memory cell layer, said first trenches extending in a first direction, thereby forming first wirings extending in the first direction and separating said first memory cell layer by said first trenches;
    burying a first interlayer film in said first trenches to form a first stacked body;
    forming a second wiring layer above said first stacked body;
    forming a plurality of second trenches in said first stacked body with said second wiring layer formed thereabove, said second trenches extending in a second direction intersecting the first direction and reaching an upper surface of said first interlayer film in depth, thereby forming second wirings extending in the second direction;
    removing said first interlayer film isotropically from a portion exposed in said second trenches toward the interior; and
    digging said second trenches down to an upper surface of said first wirings after removing said first interlayer film isotropically, thereby forming said first memory cells in the shape of pillars separated by said first and second trenches at the intersections of said first and second wirings.

2. The method of manufacturing semiconductor memory device according to claim 1, wherein the removing said first interlayer film isotropically includes
    removing said first interlayer film down in depth at least to the upper surface of said first wirings.

3. The method of manufacturing semiconductor memory device according to claim 1, wherein the removing said first interlayer film isotropically includes
    removing said first interlayer film down in depth to the upper surface of said first wirings while leaving said first interlayer film on the bottom of said first trenches.

4. The method of manufacturing semiconductor memory device according to claim 1, further comprising:
    forming a second memory cell layer above said second wiring layer after forming said second wiring layer and before forming said second trenches, said second memory cell layer being arranged to configure second memory cells therein; and wherein
    said second trenches are formed in said first stacked body with said second wiring layer and said second memory cell layer formed thereabove.

5. The method of manufacturing semiconductor memory device according to claim 4, further comprising, after forming said first memory cells in the shape of pillars:
    burying a second interlayer film in at least said second trenches to form a second stacked body;
    forming a third wiring layer above said second stacked body;
    forming a plurality of third trenches in said second stacked body with said third wiring layer formed thereabove, said third trenches extending in the first direction and reaching an upper surface of said second interlayer film in depth, thereby forming third wirings extending in the first direction;

removing said second interlayer film isotropically from a portion exposed in said third trenches toward the interior; and digging said third trenches down to an upper surface of said second wirings after removing said second interlayer film isotropically, thereby forming said second memory cells in the shape of pillars separated by said second and third trenches at the intersections of said second and third wirings.

6. The method of manufacturing semiconductor memory device according to claim 1, wherein said first interlayer film comprises an organic film.

7. The method of manufacturing semiconductor memory device according to claim 1, wherein said first interlayer film comprises a carbon-containing film.

8. The method of manufacturing semiconductor memory device according to claim 1, wherein the removing said interlayer film isotropically includes a wet etching or ashing, or a combination thereof.

9. The method of manufacturing semiconductor memory device according to claim 8, wherein said wet etching uses a thinner organic solvent or an aqueous solution of TMAH (tetramethylammonium hydride).

10. A method of manufacturing semiconductor memory device, comprising:

forming a first wiring layer above a semiconductor substrate;

forming a first memory cell layer above said first wiring layer, said first memory cell layer arranged to configure first memory cells therein;

forming a plurality of first trenches in said formed first wiring layer and said first memory cell layer, said first trenches extending in a first direction, thereby forming first wirings extending in the first direction and separating said first memory cell layer by said first trenches;

burying a first interlayer film in said first trenches to form a first stacked body;

forming a first sacrifice layer above said first stacked body, said first sacrifice layer extending in a second direction intersecting the first direction;

backing said first interlayer film and then etching said first memory cell layer with a mask of said first sacrifice layer to form a plurality of second trenches reaching an upper surface of said first wirings in depth, thereby forming said first memory cells in the shape of pillars separated by said first and second trenches;

removing said first interlayer film and said first sacrifice layer and burying a first interlayer insulator film in said first and second trenches to form a second stacked body;

forming a second wiring layer above said second stacked body; and forming a plurality of third trenches in said second stacked body with said second wiring layer formed thereabove, said third trenches extending in the second direction and reaching an upper surface of said first interlayer insulator film in depth, thereby forming second wirings extending in the second direction.

11. The method of manufacturing semiconductor memory device according to claim 10, further comprising:

forming a second memory cell layer above said second wiring layer after forming said second wiring layer and before forming said third trenches, said second memory cell layer being arranged to configure second memory cells therein; and wherein said third trenches are formed in said second stacked body with said second wiring layer and said second memory cell layer formed thereabove.

12. The method of manufacturing semiconductor memory device according to claim 11, further comprising, after forming said third trenches in said second stacked body with said second wiring layer and said second memory cell layer formed thereabove:

burying a second interlayer film in said third trenches to form a third stacked body;

forming a second sacrifice layer above said third stacked body, said second sacrifice layer extending in the first direction;

backing said second interlayer film and then etching said second memory cell layer with a mask of said second sacrifice layer to form a plurality of fourth trenches reaching an upper surface of said second wirings in depth, thereby forming said second memory cells in the shape of pillars separated by said third and fourth trenches;

removing said second interlayer film and said second sacrifice layer and burying a second interlayer insulator film in said third and fourth trenches to form a fourth stacked body;

forming a third wiring layer above said fourth stacked body; and forming a plurality of fifth trenches in said fourth stacked body with said third wiring layer formed thereabove, said fifth trenches extending in the first direction and reaching an upper surface of said second interlayer insulator film in depth, thereby forming third wirings extending in the first direction.

13. The method of manufacturing semiconductor memory device according to claim 10, wherein cell array layers formed through the forming said first wiring layer to the forming said second wirings are stacked in plural layers with an interlayer insulator interposed therebetween.

14. The method of manufacturing semiconductor memory device according to claim 10, wherein said first interlayer film comprises an organic film.

15. The method of manufacturing semiconductor memory device according to claim 10, wherein said first interlayer film comprises a carbon-containing film.

16. The method of manufacturing semiconductor memory device according to claim 10, wherein said first sacrifice layer comprises a multilayered film including at least an inorganic film and a carbon-containing film.

* * * * *